United States Patent
Huang et al.

(10) Patent No.: US 9,780,216 B2
(45) Date of Patent: Oct. 3, 2017

(54) COMBINATION FINFET AND METHODS OF FORMING SAME

(71) Applicant: Taiwan Semiconductor Manufacturing Company, Ltd., Hsin-Chu (TW)

(72) Inventors: Yu-Lien Huang, Jhubei (TW); Tsu-Hsiu Perng, Zhubei (TW); Tung Ying Lee, Hsin-Chu (TW); Ming-Huan Tsai, Zhubei (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 14/219,869

(22) Filed: Mar. 19, 2014

(65) Prior Publication Data
US 2015/0270401 A1    Sep. 24, 2015

(51) Int. Cl.
| H01L 29/78 | (2006.01) |
| H01L 29/66 | (2006.01) |
| H01L 21/762 | (2006.01) |
| H01L 29/10 | (2006.01) |
| H01L 29/165 | (2006.01) |
| H01L 29/267 | (2006.01) |

(52) U.S. Cl.
CPC .... *H01L 29/7851* (2013.01); *H01L 21/76224* (2013.01); *H01L 29/1054* (2013.01); *H01L 29/66795* (2013.01); *H01L 29/785* (2013.01); *H01L 29/7848* (2013.01); *H01L 29/7853* (2013.01); *H01L 29/165* (2013.01); *H01L 29/267* (2013.01); *H01L 29/66545* (2013.01)

(58) Field of Classification Search
CPC . H01L 29/7851; H01L 29/165; H01L 29/267; H01L 29/66795; H01L 29/0653; H01L 21/30604; H01L 21/76224
USPC .......................................................... 438/283
See application file for complete search history.

(56) References Cited

U.S. PATENT DOCUMENTS

| 6,207,532 B1 * | 3/2001 | Lin .................... H01L 21/76232 257/E21.549 |
| 7,297,600 B2 | 11/2007 | Oh et al. |
| 8,053,299 B2 * | 11/2011 | Xu ..................... H01L 29/66795 257/E29.255 |
| 8,450,813 B2 | 5/2013 | Luo et al. |
| 8,470,714 B1 | 6/2013 | Tsai et al. |
| 8,829,606 B1 | 9/2014 | van Dal |
| 2005/0090096 A1 * | 4/2005 | Hou ....................... H01L 21/743 438/637 |
| 2007/0235763 A1 | 10/2007 | Doyle et al. |

(Continued)

OTHER PUBLICATIONS

Kringhøj, P., et al., "Diffusion of ion implanted Sn in Si, Si1-xGex, and Ge," Appl. Phys. Lett. 65, 324 (1994), 4 pages.

(Continued)

*Primary Examiner* — Mark Prenty
(74) *Attorney, Agent, or Firm* — Slater Matsil, LLP

(57) ABSTRACT

An embodiment fin field effect transistor (finFET) includes a fin extending upwards from a semiconductor substrate and a gate stack. The fin includes a channel region. The gate stack is disposed over and covers sidewalls of the channel region. The channel region includes at least two different semiconductor materials.

20 Claims, 24 Drawing Sheets

(56) References Cited

U.S. PATENT DOCUMENTS

| | | | |
|---|---|---|---|
| 2012/0138886 A1* | 6/2012 | Kuhn | B82Y 10/00 |
| | | | 257/9 |
| 2012/0319211 A1 | 12/2012 | van Dal et al. | |
| 2013/0200482 A1* | 8/2013 | Fang | H01L 29/66181 |
| | | | 257/506 |
| 2013/0256799 A1 | 10/2013 | Wu et al. | |
| 2014/0197458 A1* | 7/2014 | Ching | H01L 29/7849 |
| | | | 257/192 |

OTHER PUBLICATIONS

Kube, R., et al., "Composition dependence of Si and Ge diffusion in relaxed Si1-xGex alloys," J. Appl. Phys. 107, 073520 (2010); 7 pages.

Pillarisetty, R., et al., "High Mobility Strained Germanium Quantum Well Field Effect Transistor as the P-Channel Device Option for Low Power (Vcc=0.5V) III-V CMOS Architecture," 2010 IEEE International Electron Devices Meeting (IEDM), San Francisco, CA, Dec. 6-8, 2010, pp. 6.7.1-6.7.4.

Silvestri, H.H., et al., "Diffusion of silicon in crystalline germanium," Semicond. Sci. Technol. 21 (2006), pp. 758-762.

\* cited by examiner

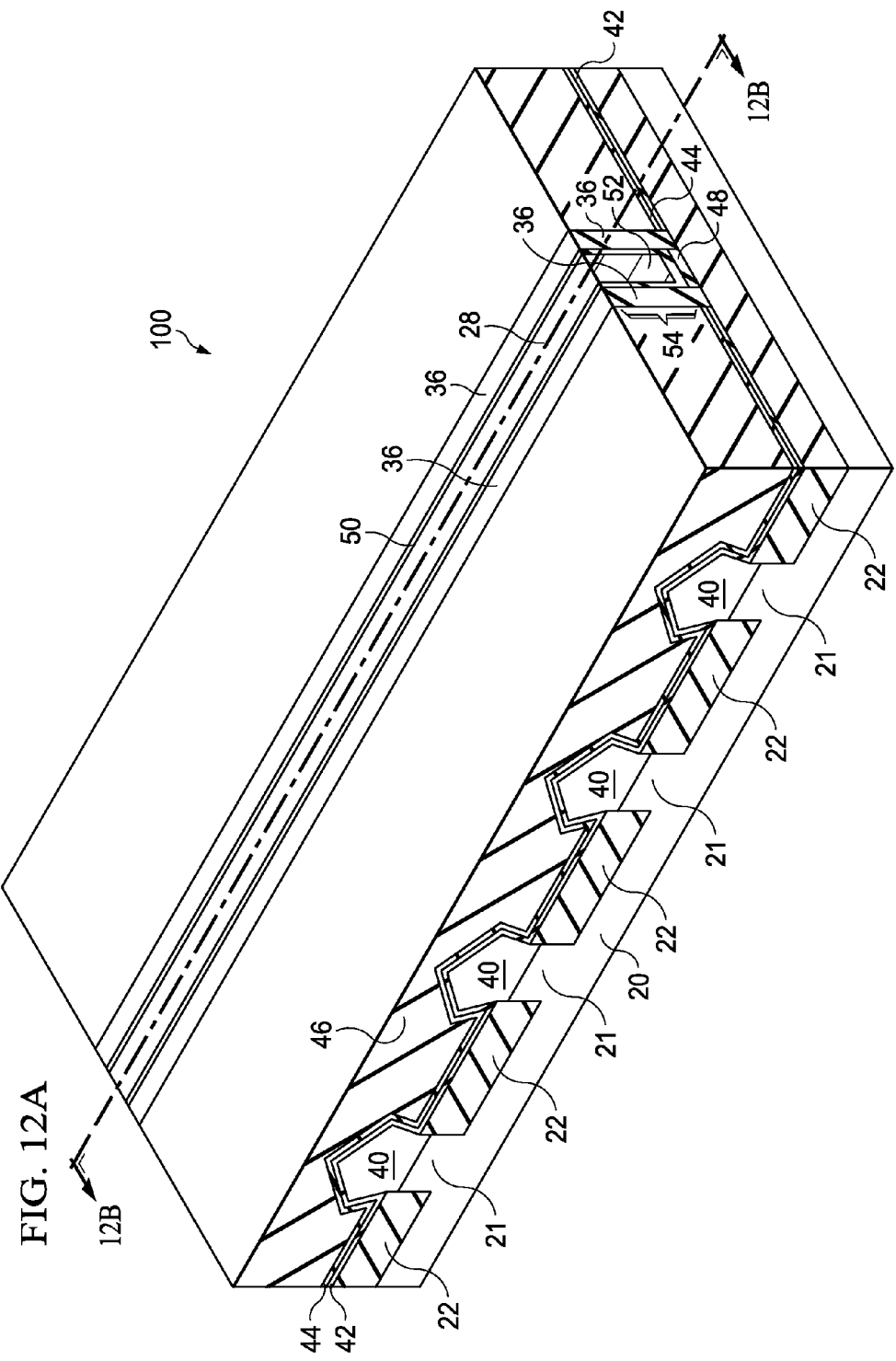

COMBINATION FINFET AND METHODS OF FORMING SAME

BACKGROUND

With the increasing down-scaling of integrated circuits (IC) and increasingly demanding requirements to the speed of ICs, transistors need to have higher drive currents with increasingly smaller dimensions. Fin field-effect transistors (FinFET) were thus developed. In a typical finFET, a vertical fin structure is formed over a substrate. This vertical fin structure is used to form source/drain regions in the lateral direction and a channel region in the fin. A gate is formed over the channel region of the fin in the vertical direction forming a finFET. Subsequently, an inter-layer dielectric (ILD) and a plurality of interconnect layers may be formed over the finFET.

Low-power and high-speed circuits are desired in current electronic applications such as smart phones, PDAs, notebooks, and so on. Compared to traditional substrate/fin materials (e.g., silicon), other semiconductor materials (e.g., germanium, silicon germanium, or other group III/group IV/group V elements) has higher mobility and lower effective mass, which benefits the drive current of Field-Effect-Transistors (FETs). Therefore, these other semiconductor materials are promising materials for the next-generation of FETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 12B illustrate perspective and cross-sectional views of various intermediate steps of manufacturing a combination finFET in in accordance with some embodiments;

DETAILED DESCRIPTION

Figure 1:
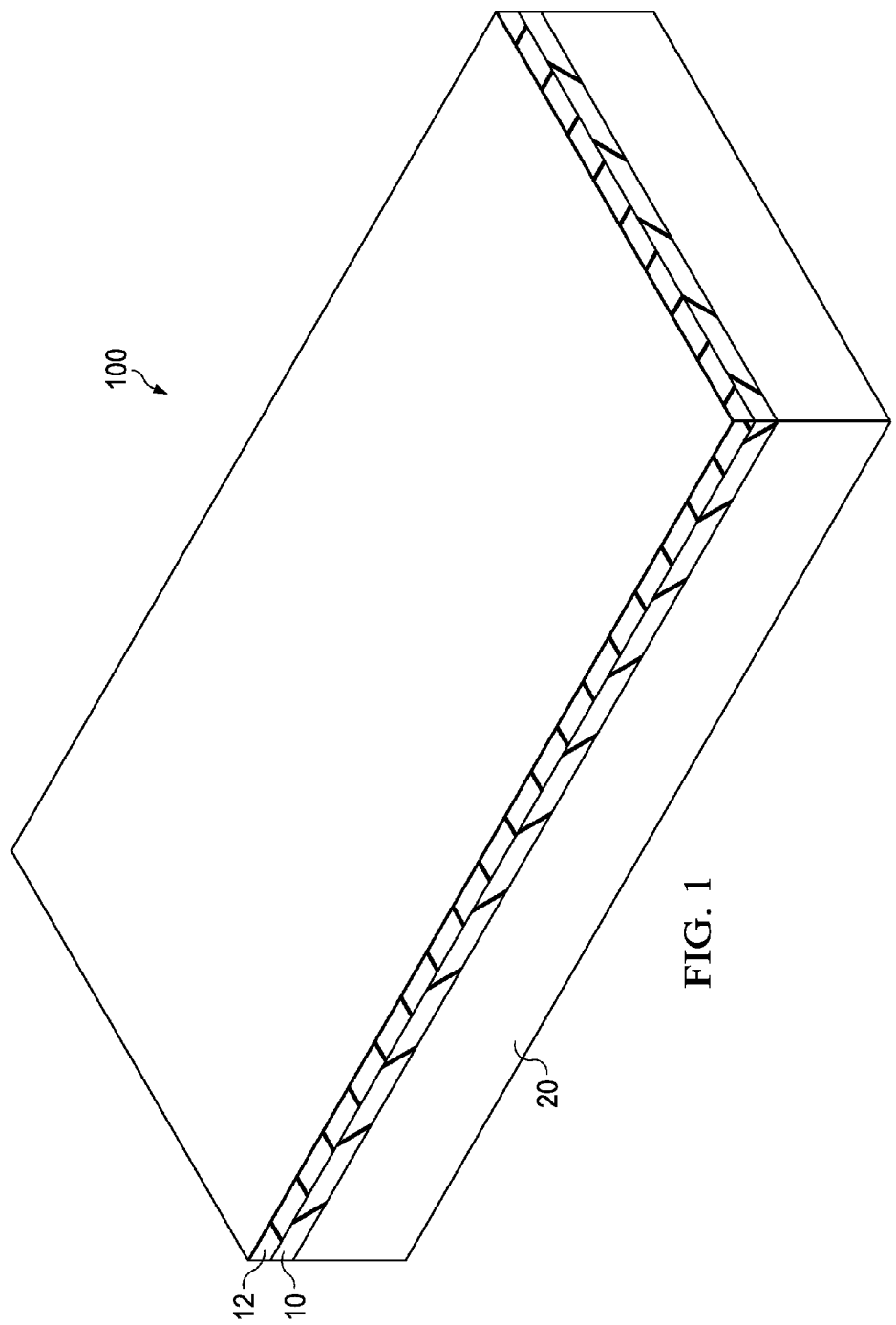

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a combination fin field-effect transistor (finFET) structure having one or more fins. A channel region of each fin includes two or more different semiconductor materials. For example, the channel region of each fin may include a first semiconductor material disposed over a second semiconductor material. A ratio of a height of the first semiconductor material to a height of the channel region may be greater than about 0.6. The first semiconductor material may include germanium (Ge), silicon germanium (SiGe), indium gallium arsenic (InGaAs), or other group III/group IV/group V semiconductor materials, which may have a higher intrinsic mobility than the second semiconductor material. The second semiconductor material may be silicon, which may have a lower $D_{it}$ (interface trap density) than the first semiconductor material. By including two different semiconductor materials in the channel region of a fin, a high mobility semiconductor material's intrinsically higher $D_{it}$ may be balanced by a lower $D_{it}$ of a second semiconductor material, which may result in better overall electrical performance in the combination finFET device.

FIGS. 1 through 12B are perspective views and cross-sectional views of intermediate stages in the manufacturing of a FinFET in accordance with some example embodiments. FIG. 1 illustrates a perspective view of an initial structure. The initial structure includes wafer 100 having substrate 20. Substrate 20 may be semiconductor substrate such as a bulk substrate, a silicon-on-insulator (SOI) substrate, or the like. In various embodiments, substrate 20 may include a semiconductor material having a relatively low $D_{it}$, such as, silicon. Pad layers 10 and 12 may be disposed over substrate 20. Pad layer 10 may include an oxide (e.g., silicon oxide) while pad layer 12 may include a nitride (e.g., silicon nitride). Pad layers 10 and 12 may act as an etch stop layer and a protective layer for portions of substrate 20 during the formation of shallow trench isolation (STI) regions (e.g., STI regions 22 illustrated in FIG. 3) in subsequent process steps.

Figure 2:
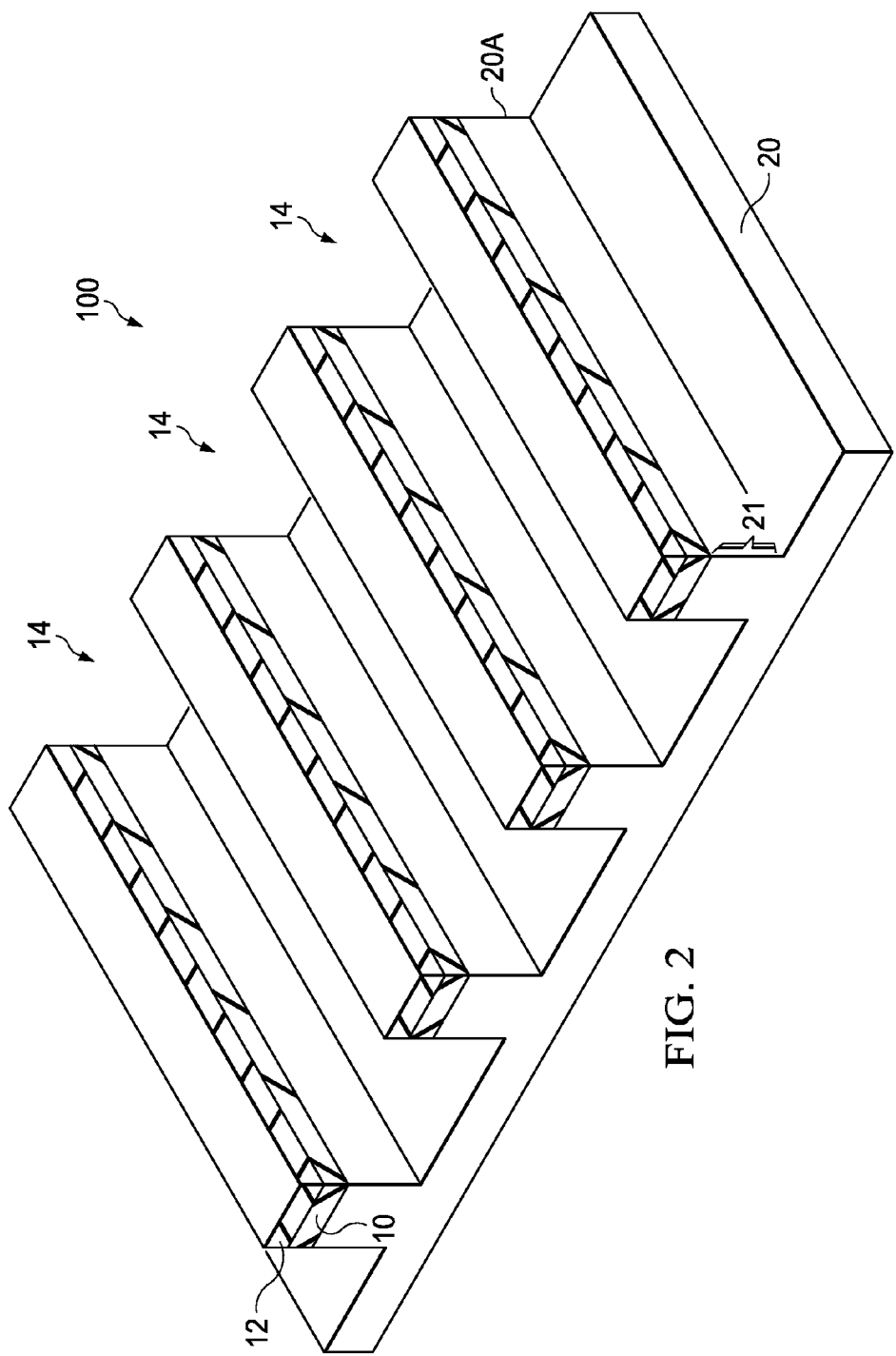
Figure 3:
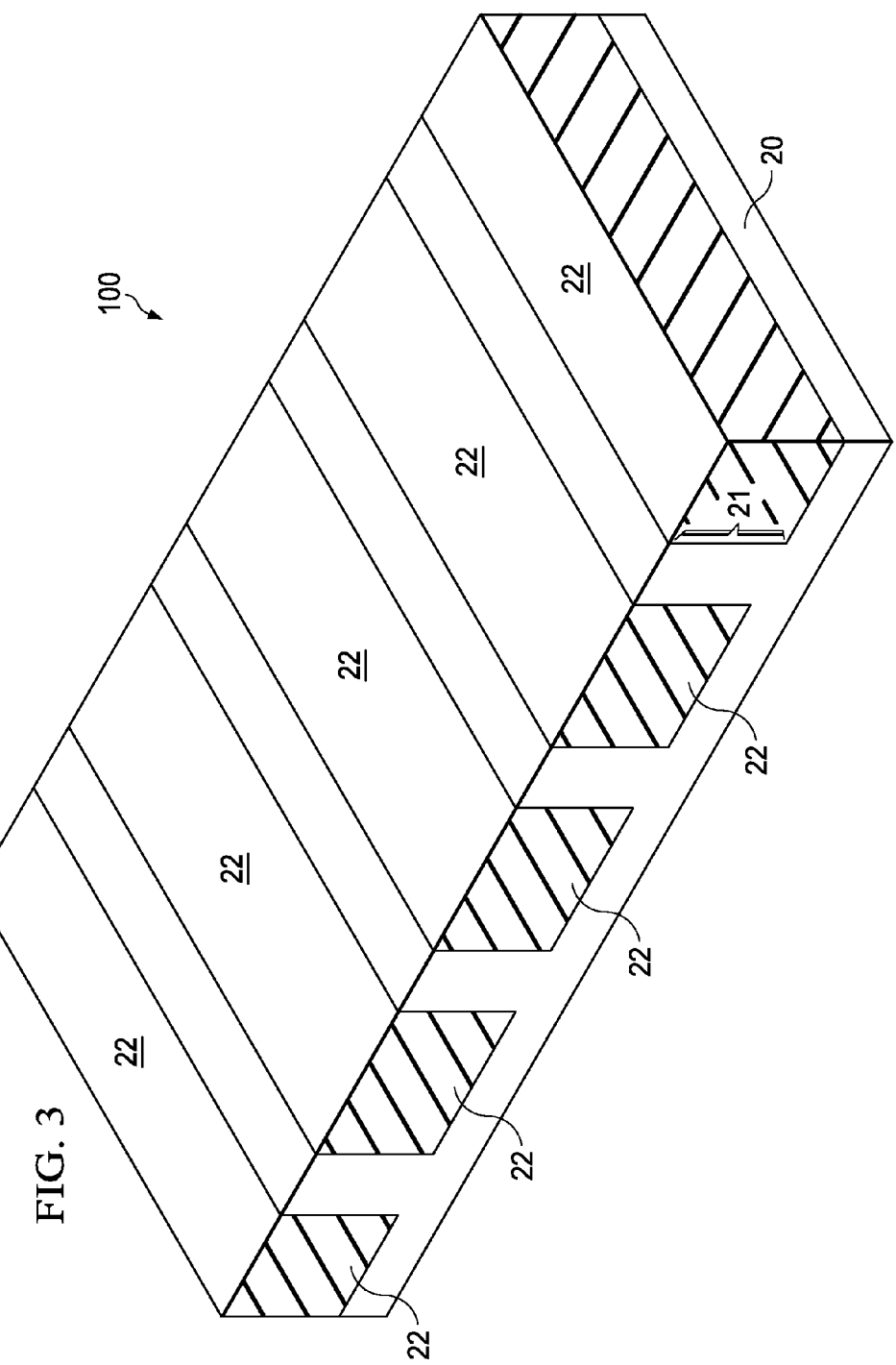

FIGS. 2 and 3 illustrate the formation of STI regions 22 extending from a top surface of substrate 20 (labeled as surface 20A) into substrate 20. In FIG. 2, substrate 20 and pad layers 10 and 12 are patterned to form openings 14, for example, using a combination of photolithography and etching. The portions of substrate 20 between openings 14 are referred to as semiconductor strips 21.

Openings 14 may be filled with a dielectric material, such as, silicon oxide, silicon nitride, silicon oxynitride, fluoride-doped silicate glass (FSG, or another low-k dielectric material. The filling of openings 14 may be done using any suitable process such as chemical vapor deposition (CVD), or the like. An annealing process may be performed on the dielectric material. A chemical mechanical polish (CMP) or etch back process may be used to level a top surface of the dielectric material using pad layer 12 as an etch stop layer. Pad layer 12 may be removed after the CMP/etch back. Subsequently, well and anti-punch through (APT) dopants may be implanted into substrate 20 and the dielectric material. Pad layer 10 may act as a protective layer during the implantation, and after implantation, pad layer 10 may be removed. FIG. 3 illustrates completed STI regions 22 formed between semiconductor strips 21. The top surfaces of semiconductor strips 21 and the top surfaces of STI regions 22 may be substantially level with each other.

Figure 4:
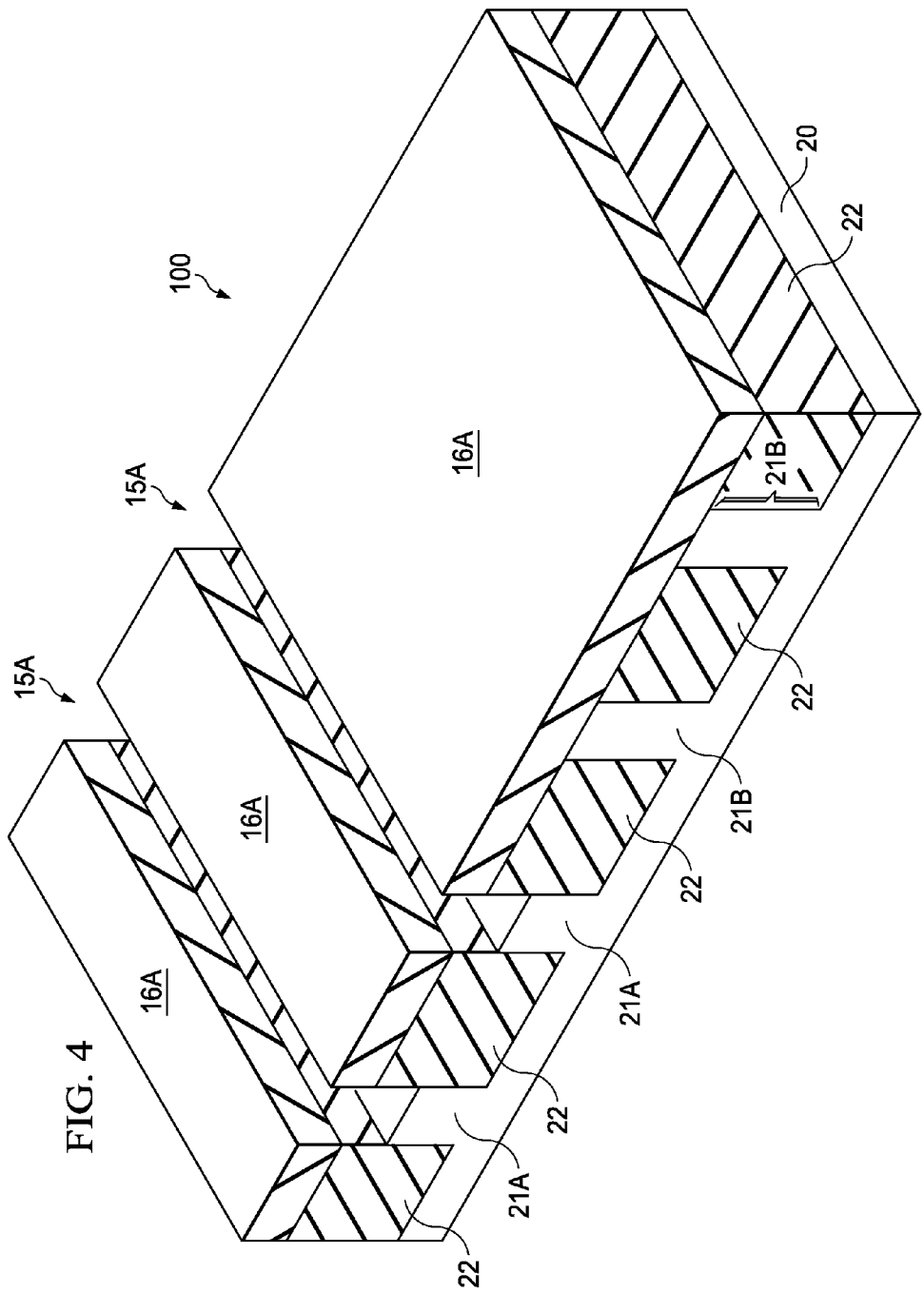
Figure 5:
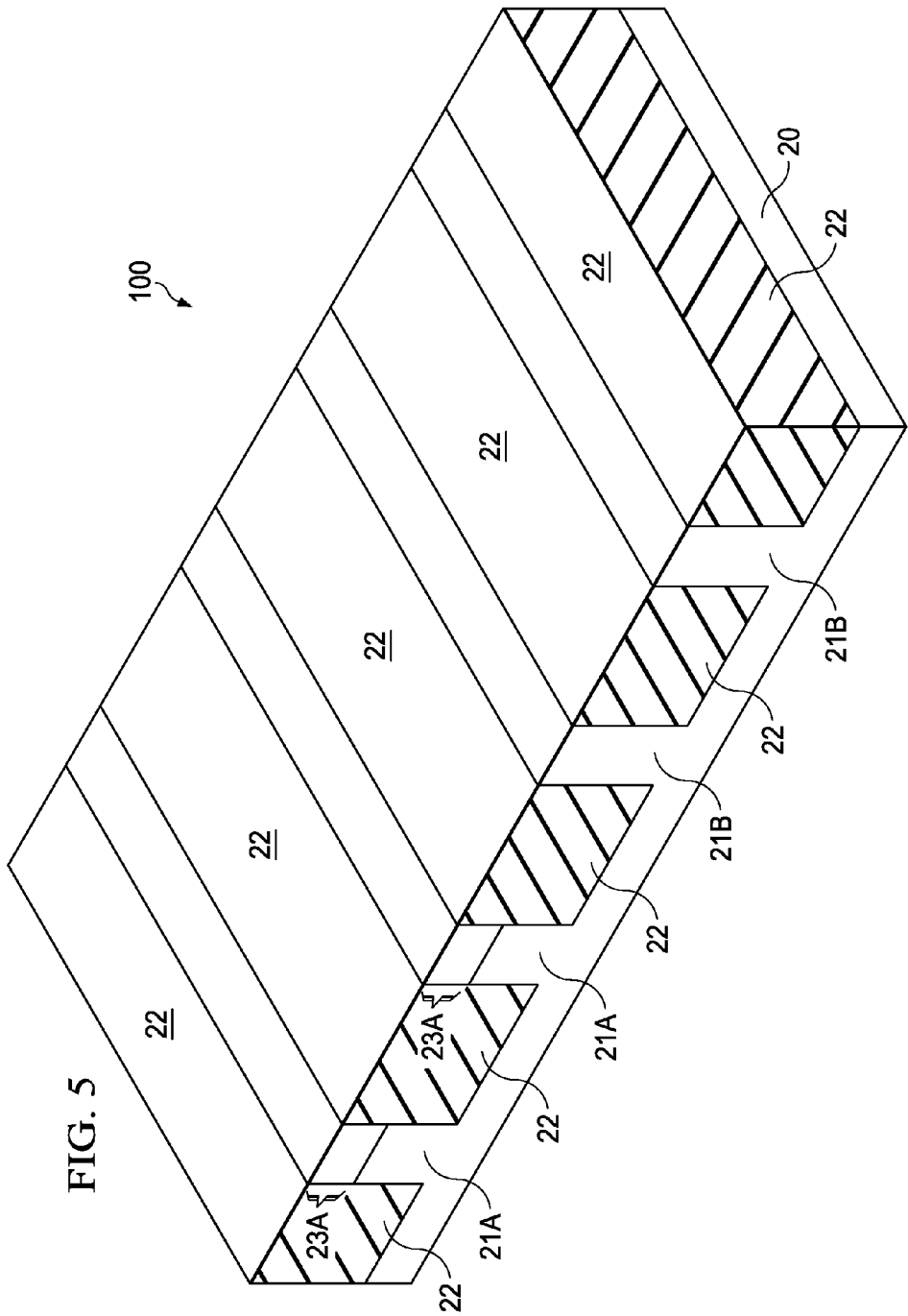
Figure 6:
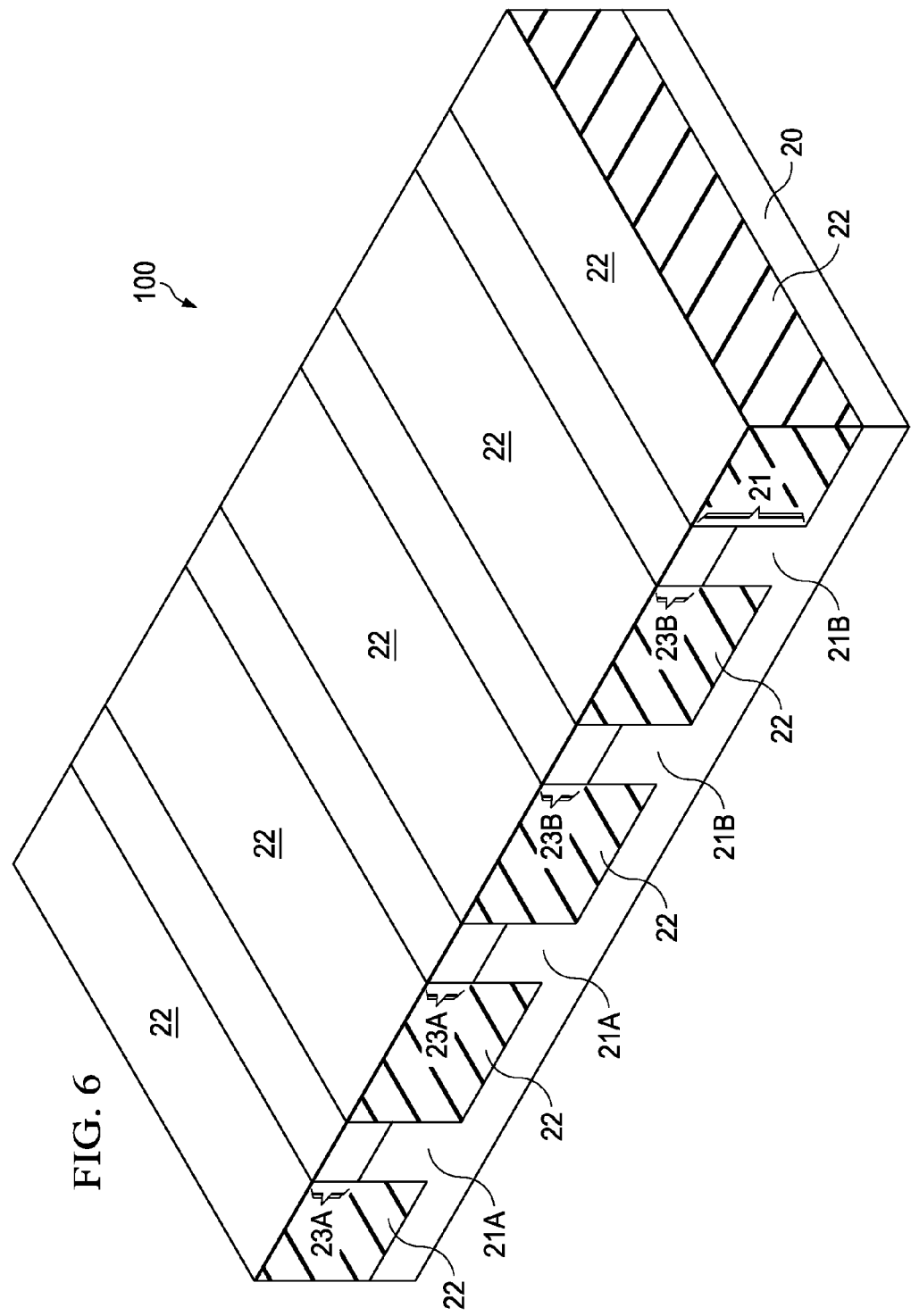

FIGS. 4 through 6 illustrate the replacement of the top portions of semiconductor strips 21 with semiconductor strips 23 (labeled 23A and 23B in FIG. 6). FIGS. 4 through 6 illustrate the formation of both n-channel semiconductor strips 23A and p-channel semiconductor strips 23B in wafer 100. For example, upper portions of semiconductor strips 21A selected for n-channel growth are removed to form recesses 15A as illustrated by FIG. 4. The recessing of semiconductor strips 21A may include a combination of photolithography and etching. After photolithography, hard mask 16A (e.g., a silicon oxide or silicon nitride layer) may be formed over semiconductor strips 21B to protect semiconductor strips 21B during n-channel epitaxy growth (see FIG. 5).

Next, as illustrated by FIG. 5, an epitaxy is performed to epitaxially grow semiconductor strips 23A in recesses 15A. Semiconductor strips 23A may include a semiconductor material having a relatively high mobility, such as, germanium, indium gallium arsenic, or other group III/IV/V semiconductor materials. In some embodiments, semiconductor strips 23A include pure germanium or germanium in combination with another material (e.g., SiGe, SiGeSn, or the like). In such embodiments, an atomic percentage of germanium in semiconductor strips 23A may be at least about 10%. In other embodiments, semiconductor strips 23A include indium gallium arsenic in any combination of atomic percentages of indium, gallium, and arsenic, respectively. During the epitaxy of n-channel semiconductor strips 23A, an n-type impurity may be in-situ doped with the proceeding or the epitaxy. After n-channel semiconductor strips 23A are grown, hard mask 16A may be removed, and a CMP may be performed to level a top surface of n-channel semiconductor strips 23A with top surfaces of STI regions 22. FIG. 5 illustrates the completed structure after top surfaces of n-channel semiconductor strips 23A are leveled.

FIG. 6 illustrates the replacement of the top portions of semiconductor strips 21B with p-channel semiconductor strips 23B. A process similar to the process illustrated by FIGS. 4 and 5 may be used to recess semiconductor strips 21B and epitaxially grow p-channel semiconductor strips 23B. A hard mask (not shown) similar to hard mask 16A may be used to mask semiconductor strips 21A/23A during the formation of p-channel semiconductor strips 23B. During the epitaxy of p-channel semiconductor strips 23B, a p-type impurity may be in-situ doped with the proceeding or the epitaxy.

P-Channel semiconductor strips 23B may include a semiconductor material having a relatively high mobility, such as, germanium, indium gallium arsenic, or other group III/IV/V semiconductor materials. In some embodiments, semiconductor strips 23B include pure germanium or germanium in combination with another material (e.g., SiGe, SiGeSn, or the like). In such embodiments, an atomic percentage of germanium in semiconductor strips 23B may be at least about 10%. In other embodiments, semiconductor strips 23B include indium gallium arsenic in any combination of atomic percentages of indium, gallium, and arsenic, respectively. In some embodiments, the stress effects of n-channel semiconductor strips 23A and p-channel 23B may differ. After p-channel semiconductor strips 23B are grown, the hard mask may be removed, and a CMP may be performed to level a top surface of p-channel semiconductor strips 23B with top surfaces of STI regions 22 and n-channel semiconductor strips 23A.

Thus, fins 21/23 are formed extending upwards from substrate 20. Although FIG. 6 illustrates a particular configuration of n-channel semiconductor strips 23A and p-channel semiconductor strips 23B, other embodiments may include different configurations of n-channel and/or p-channel semiconductor strips 23A/23B depending on finFET layout design.

STI regions 22 are then recessed, so that top portions of semiconductor strips 23 are higher than the top surfaces of STI regions 22. The recessing of STI regions 22 may further expose portions of semiconductor strips 21, and top surfaces of semiconductor strips 21 may be higher than top surfaces of STI regions 22. The recessing of STI regions 22 may include a chemical etch process, for example, using ammonia ($NH_3$) in combination with hydrofluoric acid (HF) or nitrogen trifluoride ($NF_3$) as reaction solutions either with or without plasma. When HF is used as the reaction solution, a dilution ratio of HF may be between about 1:50 to about 1:100.

Figure 7:
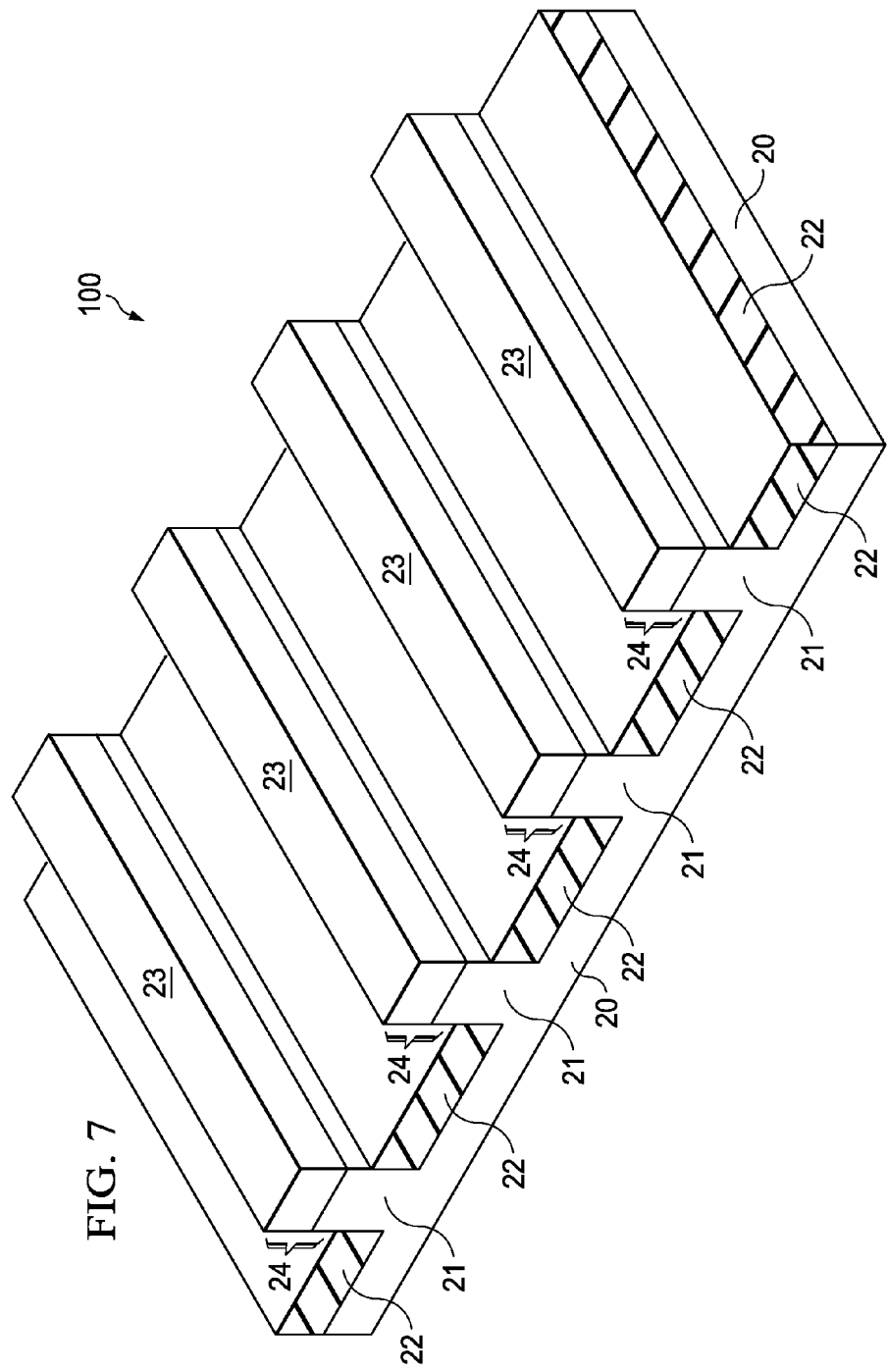

Channel regions 24 are thus formed in fins 21/23. In the completed finFET structure, a gate wraps around and covers sidewalls of channel regions 24 (see FIG. 12B). Each channel region may include two different semiconductor materials, the material of semiconductor strip 23 (e.g., a high mobility semiconductor material) and the material of semiconductor strip 21 (e.g., a low $D_{it}$ material). The resulting structure is shown in FIG. 7.

Figure 8:
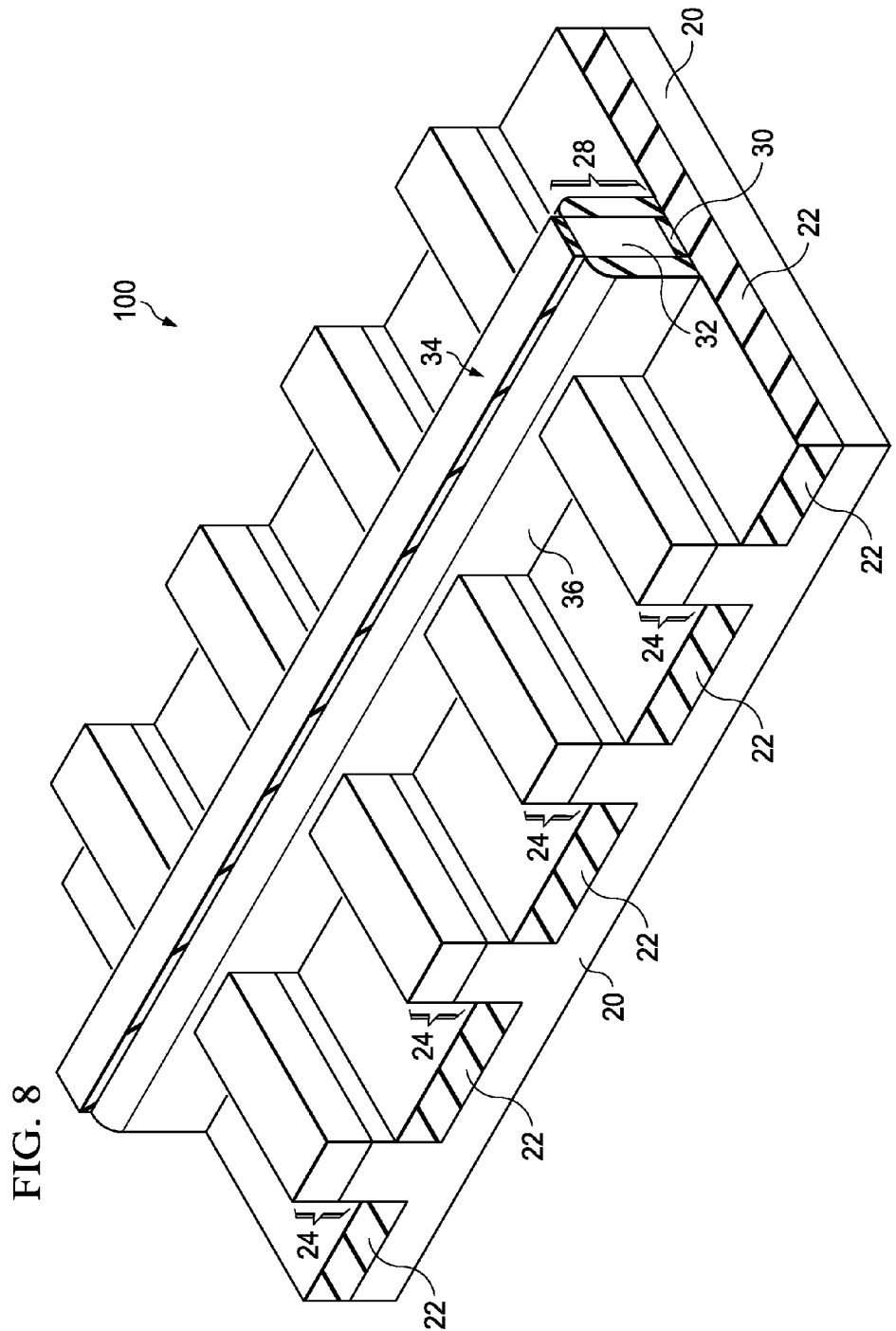

FIG. 8 illustrates the formation of gate stack 28 on the top surface and the sidewalls of channel region 24. Gate stack 28 includes dummy oxide 30 and dummy gate 32 over dummy oxide 30. Dummy gate 32 may be formed, for example, using polysilicon, although materials such as metal silicides, metal nitrides, or the like, may also be used. Gate stack 28 may also include hard mask 34 over dummy gate 32. Hard mask 34 may include silicon nitride or silicon oxide, for example. Gate stack 28 crosses over a plurality of semiconductor fins 21/23 and/or STI regions 22 in some embodiments. Gate stack 28 may also have a lengthwise direction substantially perpendicular to the lengthwise direction of semiconductor fins 21/23.

Next, as also shown in FIG. 8, gate spacers 36 are formed on the sidewalls of gate stack 28. In some embodiments, gate spacers 36 are formed of silicon oxide, silicon nitride, or the like. Furthermore, gate spacers 36 may have a multi-layer structure, for example, with a silicon nitride layer over a silicon oxide layer.

Figure 9:
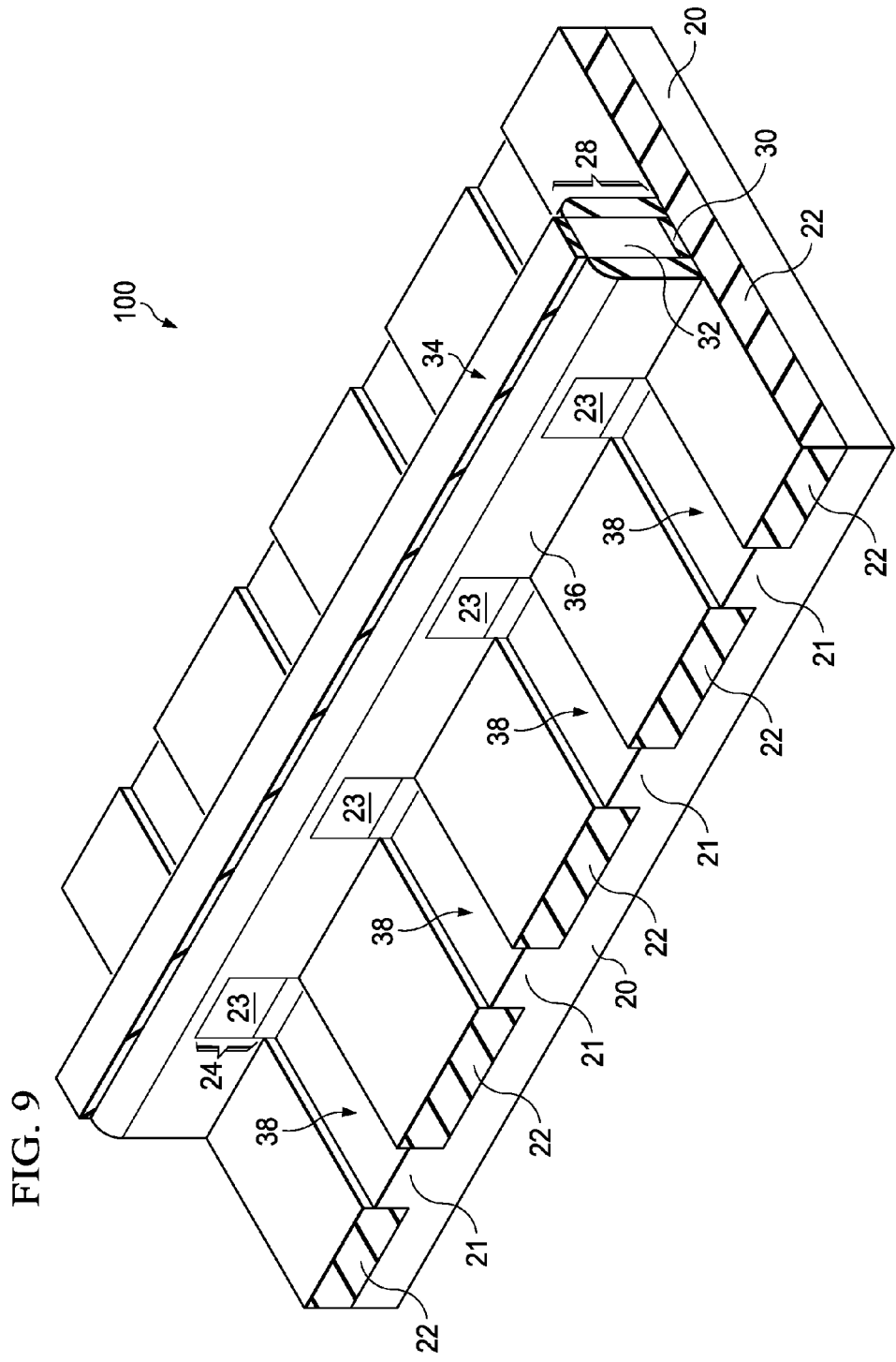

Referring to FIG. 9, an etching step is performed to etch portions of semiconductor fins 21/23 that are not covered by gate stack 28 and gate spacers 36. Recesses 38 are accordingly formed between STI regions 22. Recesses 38 are located on the opposite sides of gate stack 28. After the formation of recesses 38, a lightly doped drain (LDD) and annealing processes may be performed on exposed surfaces of semiconductor strips 21.

Figure 10:
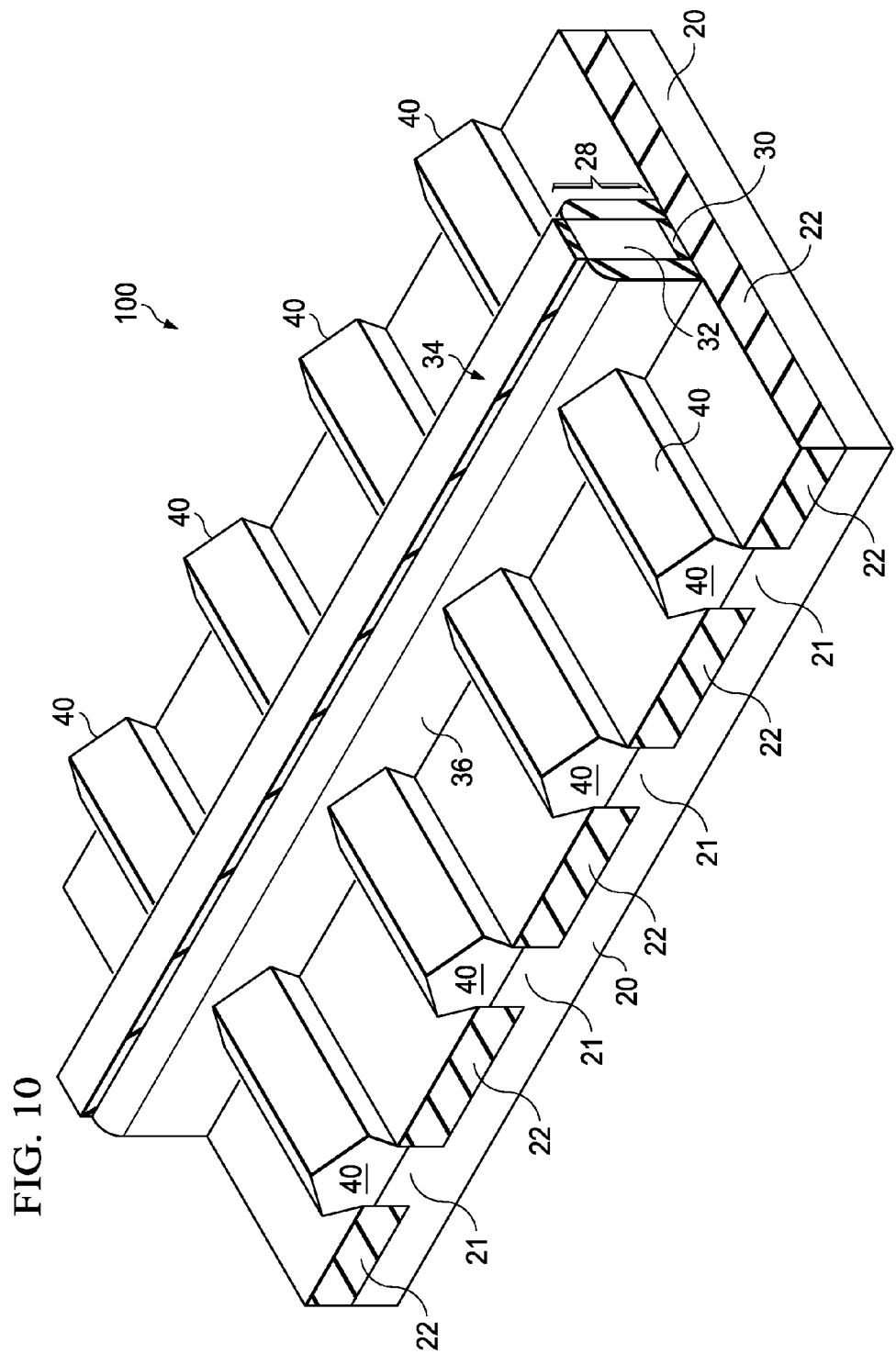

Next, as shown in FIG. 10, epitaxy regions 40 are formed by selectively growing a semiconductor material in recesses 38. In some embodiments, epitaxy regions 40 include silicon (with no germanium), germanium (with no silicon), silicon germanium, silicon phosphorous, or the like. Epitaxy regions 40 may also be formed of pure or substantially pure germanium, for example, with a germanium atomic percentage greater than about 95 percent. After recesses 38 are filled with epitaxy regions 40, the further epitaxial growth of epitaxy regions 40 causes epitaxy regions 40 to expand horizontally, and facets may start to form. Furthermore, some top surfaces of STI regions 22 may be underlying and aligned to portions of epitaxy regions 40 due to the lateral growth of epitaxy regions 40.

After the epitaxy step, epitaxy regions 40 may be implanted with p-type or n-type impurities to form source and drain regions, which are also denoted using reference numeral 40. Alternatively, the p-type or n-type impurity may be in-situ doped when epitaxy regions 40 are grown to form source and drain regions. Source and drain regions 40 are on the opposite sides of gate stack 28, and may be overlying and overlapping portions of surfaces of STI regions 22. Subsequently, hard mask 34 may be removed.

Figure 11:
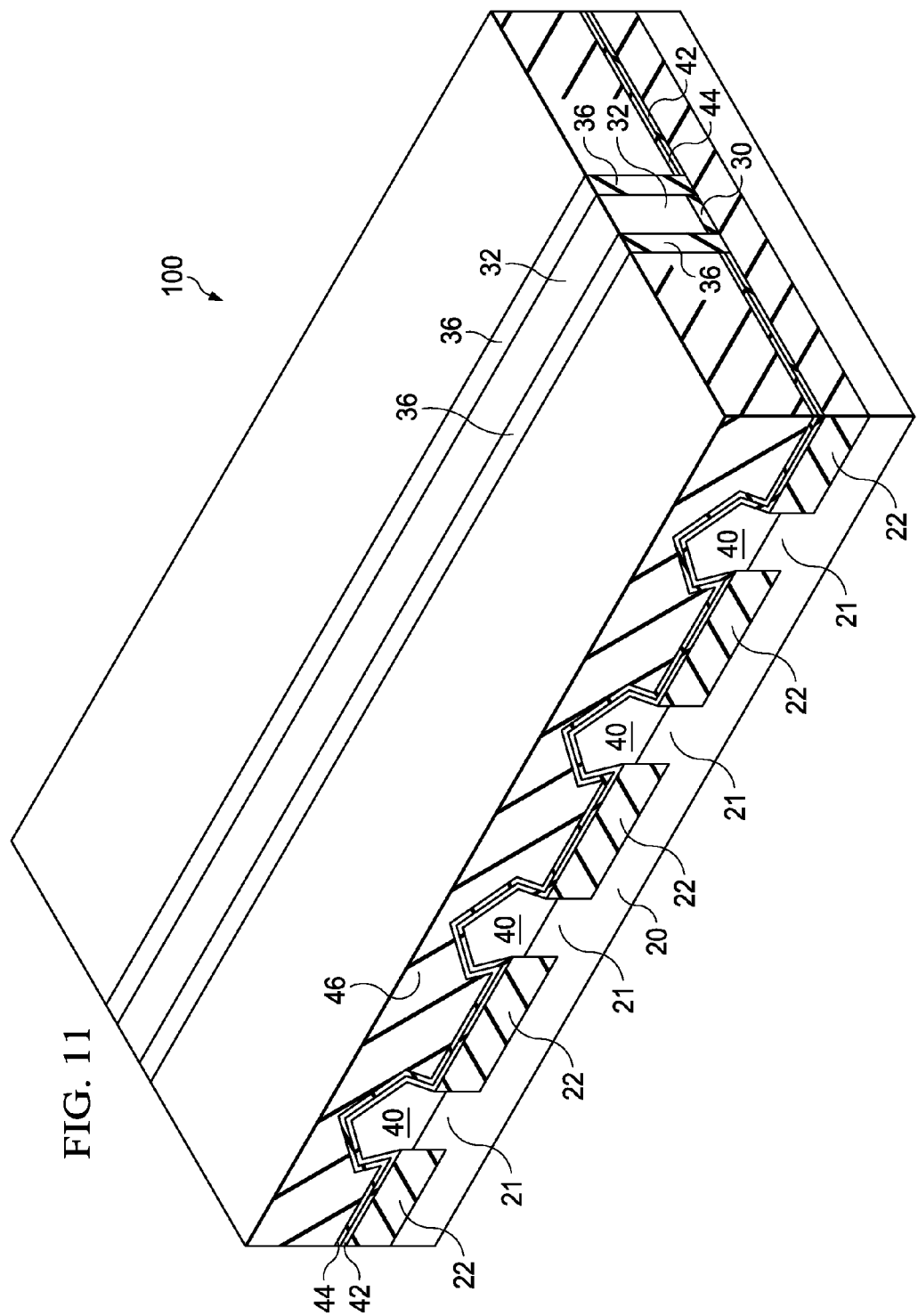

FIG. 11 illustrates wafer 100 after buffer oxide layer 42, contact etch stop layer (CESL) 44, and inter-layer dielectric (ILD) 46 are formed. In some embodiments, buffer oxide layer 42 includes silicon oxide, and CESL 44 includes silicon nitride, silicon carbonitride, or the like. Buffer oxide layer 42 and CESL 44 may be formed using atomic layer deposition (ALD), for example. ILD 46 may comprise flowable oxide formed using, for example, flowable chemical vapor deposition (FCVD). A CMP may be performed to level the top surfaces of ILD 46, gate stack 26, and gate spacers 36 with each other. Although not shown in detail in FIG. 11, buffer oxide layer 42 and CESL 44 may extend on the sidewalls of gate spacers 36 and the top surfaces of gate spacers 36 and gate stack 26.

Figure 12B:
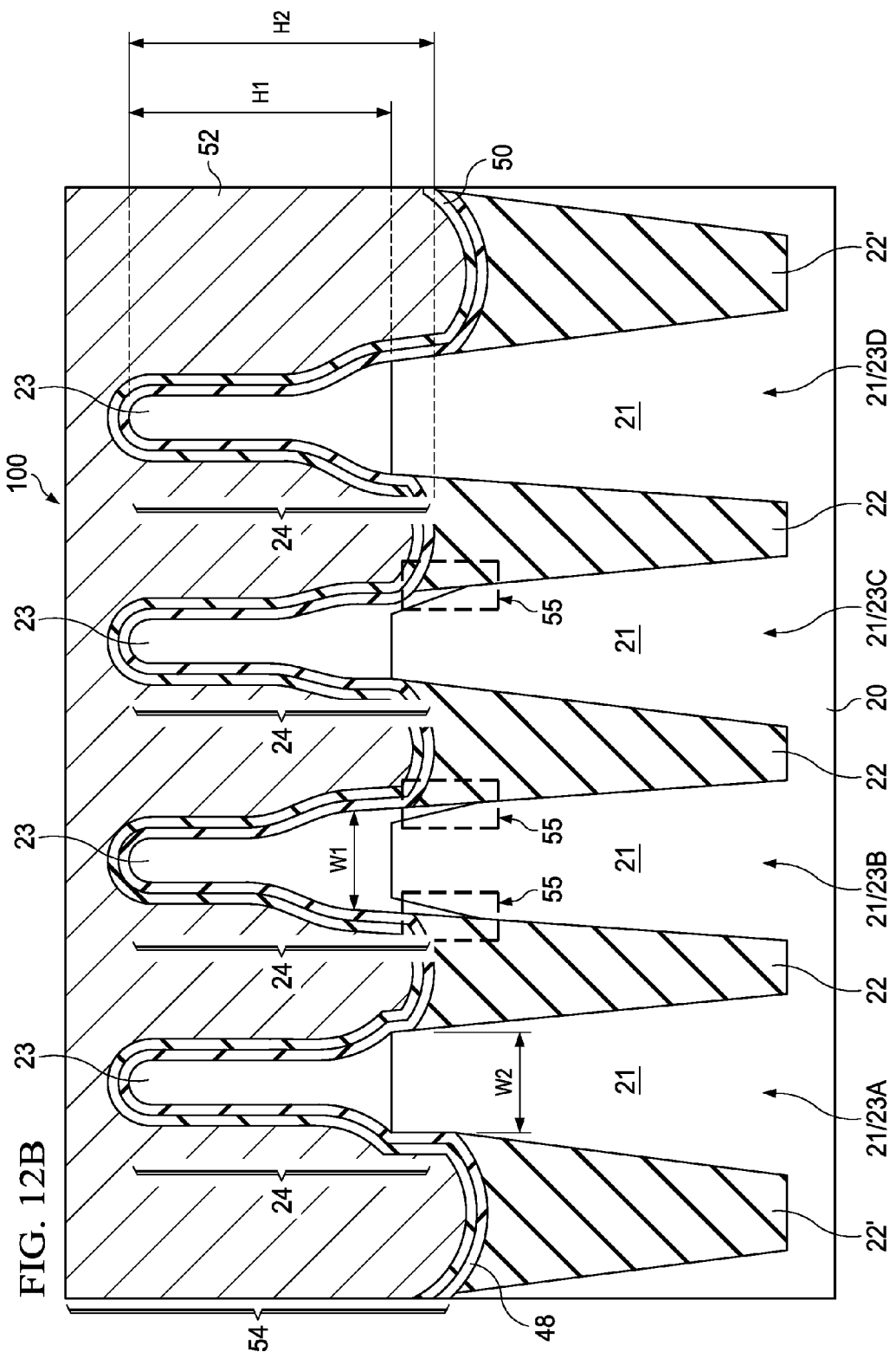

FIG. 12A illustrates a perspective view of wafer 100 after gate stack 28 (including dummy gate 32 and dummy oxide 30) are replaced with gate stack 54 (e.g., including interface layer 48, gate dielectric 50, and conductive gate 52). For example, dummy gate 32 and dummy oxide 30 may be removed to form a recess (not shown) between gate spacers 36. Interface layer 48 (e.g., an oxide) may be formed in the recess. Next, gate dielectric 50 is formed as a blanket layer in the recess and on the top surfaces and the sidewalls of channel regions 24 (see FIG. 12B) and gate spacers 36. In accordance with some embodiments, gate dielectric 50 includes silicon oxide, silicon nitride, or multilayers thereof. In alternative embodiments, gate dielectric 50 includes a high-k dielectric material. In such embodiments, gate dielectric 50 may have a k value greater than about 7.0, and may include a metal oxide or a silicate of hafnium (Hf), aluminum (Al), zirconium (Zr), lanthanum (La), magnesium (Mg), barium (Ba), titanium (Ti), lead (Pb), and combinations thereof. The formation methods of gate dielectric 50 may include molecular beam deposition (MBD), ALD, plasma enhanced CVD (PECVD), or the like. Next, conductive gate 52 is formed over gate dielectric 50 by filling the remaining recess with a conductive material. Conductive gate 52 may include a metal-containing material such as titanium nitride (TiN), tantalum nitride (TaN), tantalum carbon (TaC), colbalt (Co), ruthenium (Ru), aluminum (Al), combinations thereof, or multi-layers thereof. After the filling of conductive gate 52, a CMP is performed to remove the excess portions of gate dielectric 50 and conductive gate 52. The resulting remaining portions of interface layer 48, conductive gate 52, and gate dielectric 50 thus form a gate stack 54 of the resulting FinFET as illustrated in FIG. 12A. Source/drain contacts (not shown), for example, comprising nickel (Ni), tungsten (W), or the like may then be formed in ILD 46 using any suitable process to electrically connect with source/drain regions 40.

FIG. 12B illustrates a cross-sectional view obtained from the vertical plane crossing line 12B-12B' in FIG. 12A, where the vertical plane cuts through, and extends in the lengthwise direction of gate 54. Gate stack 54 wraps around channel regions 24 of fins 21/23 (labeled 21/23A through 21/23D). In the completed finFET structure, channel regions 24 are defined as the portions of fins 21/23 wrapped by gate stack 54. Channel regions 24 include at least two different semiconductor materials, the material of semiconductor strip 21 (e.g., a low $D_{it}$ material such as silicon) and the material of semiconductor strip 23 (e.g., a high mobility material such as germanium or indium gallium arsenic). As illustrated by FIG. 12B, semiconductor strip 23 has a vertical dimension H1 while channel region 24 has a vertical dimension H2. In various embodiments, a ratio of H1 to H2 may be at least 0.6 but less than 1 for improved electrical performance (e.g., improved overall mobility). By including two different semiconductor materials in channel region 24, particularly in the above stated ratio, the resulting finFET may have improved mobility and electrical performance compared to traditional finFETs having single semiconductor material channel regions.

The physical structure of fins 21/23 may vary in a single finFET or among different finFETs. FIG. 12B illustrates some alternative example structures for fins 21/23. For example, as illustrated by fin 21/23A, semiconductor strip 23 may be smoothly connected to semiconductor strip 21 and horizontal dimensions of semiconductor strips 21 and 23 at the interface between semiconductor strips 21 and 23 may be substantially equal. In other embodiments, at or near an interface between the two semiconductor strips 21 and 23, semiconductor strip 23 may expand outwards as illustrated in fin 21/23B. For example, a horizontal dimension W1 of semiconductor strip 23 may be wider than horizontal dimension W2 of the interface between semiconductor strips 21 and 23. In other embodiments, semiconductor strip 21 may expand outwards from semiconductor strip 23, and horizontal dimension W2 may be wider than horizontal dimension W1.

Fins 21/23 may or may not include inter-diffusion regions 55. For example, some fins 21/23A and 21/23D are substantially free of any inter-diffusion regions between semiconductor strips 21 and 23. However, other fins 21/23B and 21/23C may include inter-diffusion regions 55 between semiconductor strips 21 and 23. Although the illustrated inter-diffusion regions 55 shown a downward shape (e.g., the diffusion of the material of semiconductor strips 23 into semiconductor strips 21), inter-diffusion regions may also have an upwards shape (e.g., the diffusion of the material of semiconductor strips 21 into semiconductor strips 23). Due to the high temperature processes used in forming wafer 100 (e.g., annealing processes), the semiconductor material of semiconductor strip 23 (e.g., germanium) may diffuse into the semiconductor material of semiconductor strip 21 (e.g., silicon). This diffusion may form inter-diffusion regions 55 in fins 21/23B and 21/23C.

Furthermore, top surfaces of different STI regions 22 may or may not be substantially level. For example, due to recessing process (e.g., chemical etching), STI regions 22' at peripheral regions of fins 21/23 may have a top surface that is lower than STI regions 22 disposed between fins 21/23. Although FIG. 12B illustrates top surfaces of STI regions 22 being concave, in other embodiments, top surfaces of STI regions 22 may be concave, substantially flat, or convex.

Figure 13A:
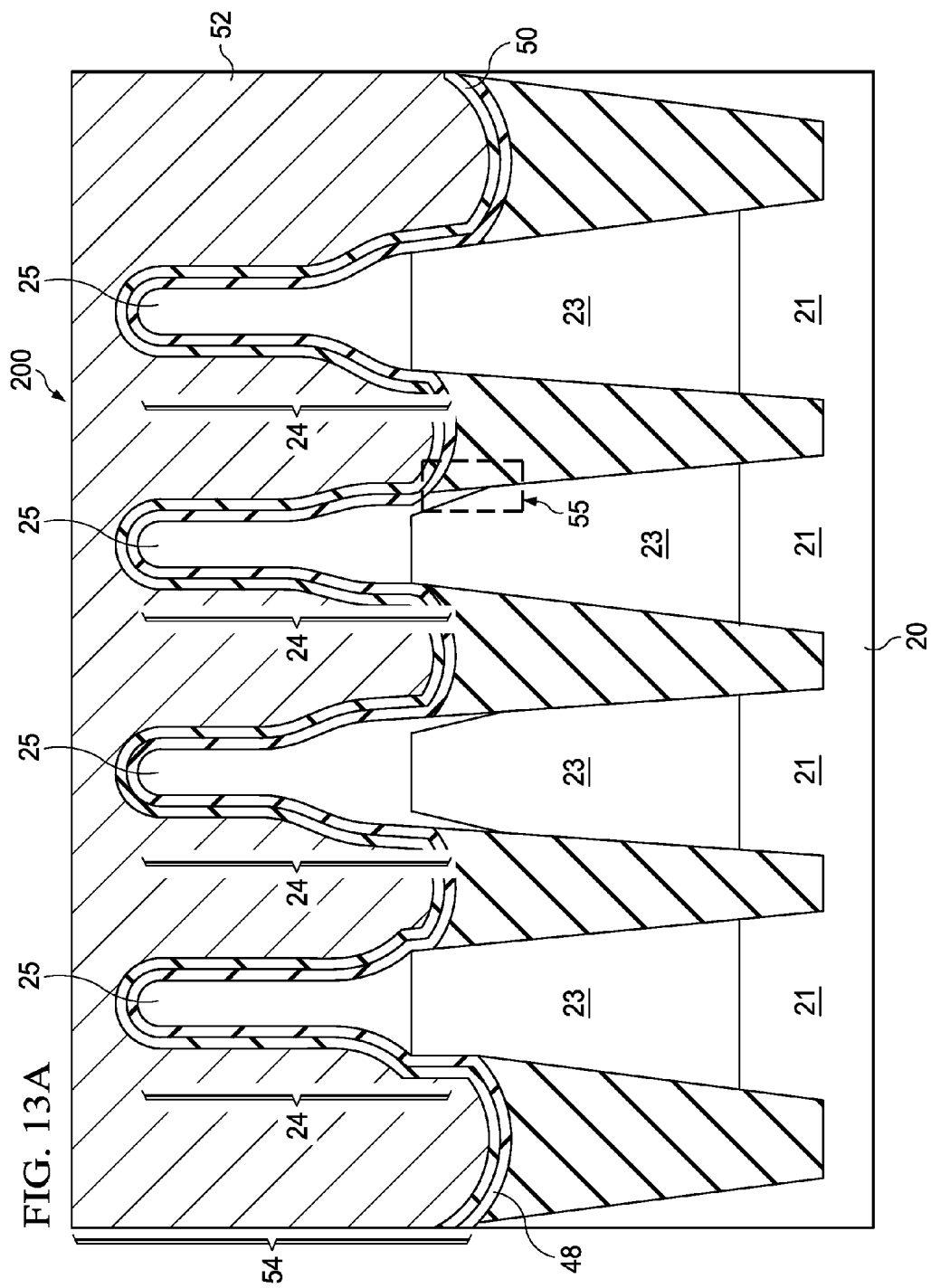
FIGS. 13A through 13B illustrate cross-sectional views of a combination finFET in accordance with some alternative embodiments.
Figure 13B:
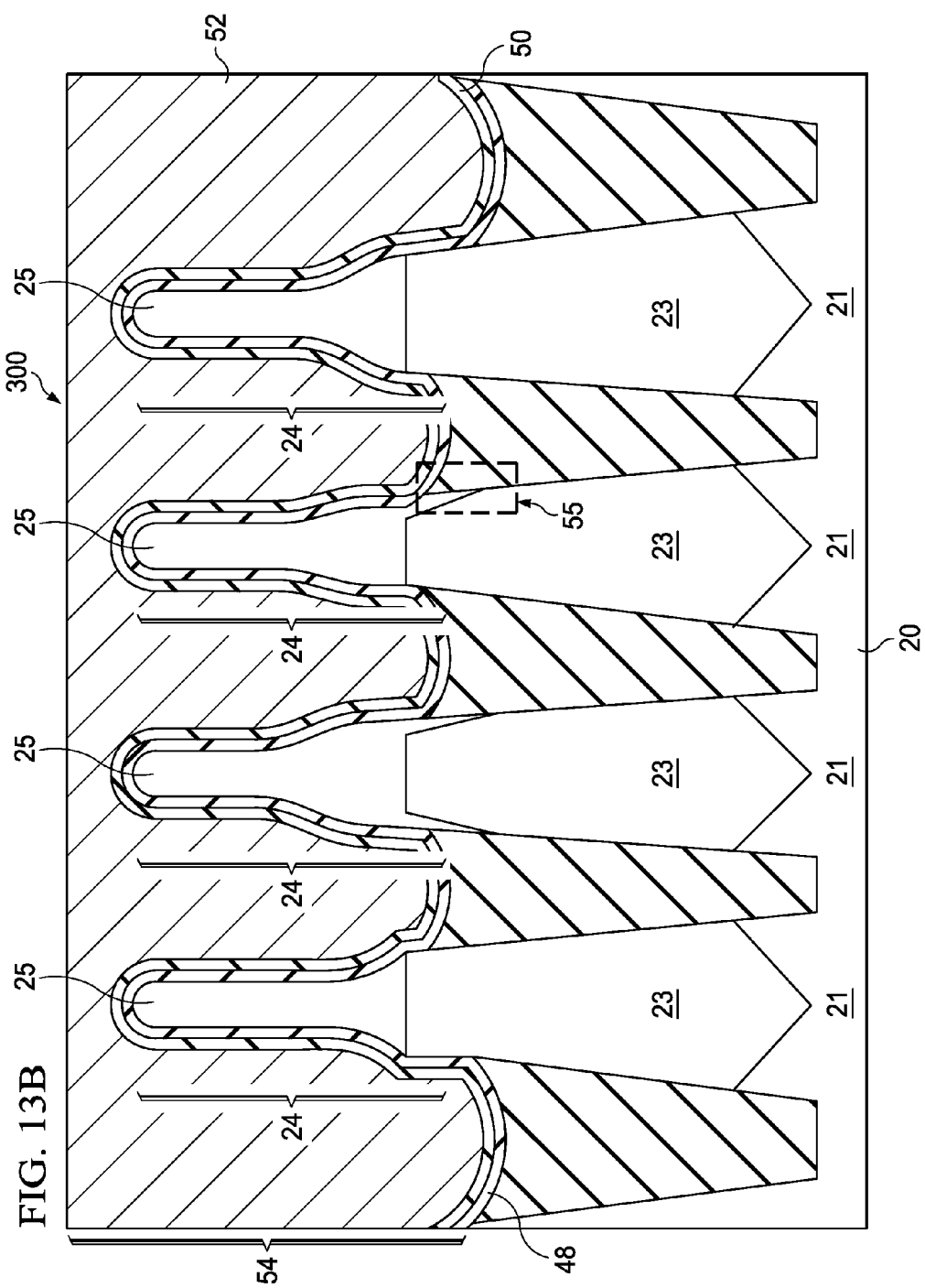

FIGS. 13A and 13B illustrate cross-sectional views of wafers 200 and 300 having combination finFETs in accordance with various alternative embodiments. Wafers 200 and 300 may be substantially similar to wafer 100 where like numerals reference like elements. However, wafers 200 and 300 may include fins 21/23/25 extending upwards from substrate 20. Fins 21/23/25 include at least three materials. For example, fins 21/23/25 may include the material of semiconductor strip 21 (e.g., silicon), the material of semiconductor strip 23 (e.g., silicon germanium), and the material of semiconductor strip 25 (e.g., substantially pure germanium). Channel regions 24 may still include at least two semiconductor materials, such as the material of semiconductor strip 25 over the material of semiconductor strip 23. In alternative embodiments, channel regions 24 may include three or more semiconductor materials. In some embodiments, the material of semiconductor strip 25 is substantially pure germanium, and the material of semiconductor strip 23 include $SiGe_x$ where x is the atomic percentage of germanium. In such embodiments, x may be between about 10% and 90%. A ratio of the vertical dimension of semiconductor strip 25 to a vertical dimension of channel region 24 may be at least 0.6 but less than 1. Furthermore, an interface between semiconductor strips (e.g., between semiconductor strips 21 and 23) may be substantially flat (as illustrated by FIG. 13A) or it may have an alternate convex or concave shape (as illustrated FIG. 13B).

Other methods for forming combination finFETs may be used in other embodiments. For example, FIGS. 1 through 6 illustrate forming fins 21/23 after forming STI regions 22 in an STI-first approach. However, fins 21/23 may also be formed prior to forming STI regions 22 in an EPI-first approach. FIGS. 14 through 17 illustrate perspective views of intermediary steps of manufacturing combination finFET in wafer 100 in accordance with alternative embodiments using an epitaxy first (EPI-first) approach. Like reference numerals in FIGS. 14 through 17 designate like elements of FIGS. 1 through 6.

Figure 14:
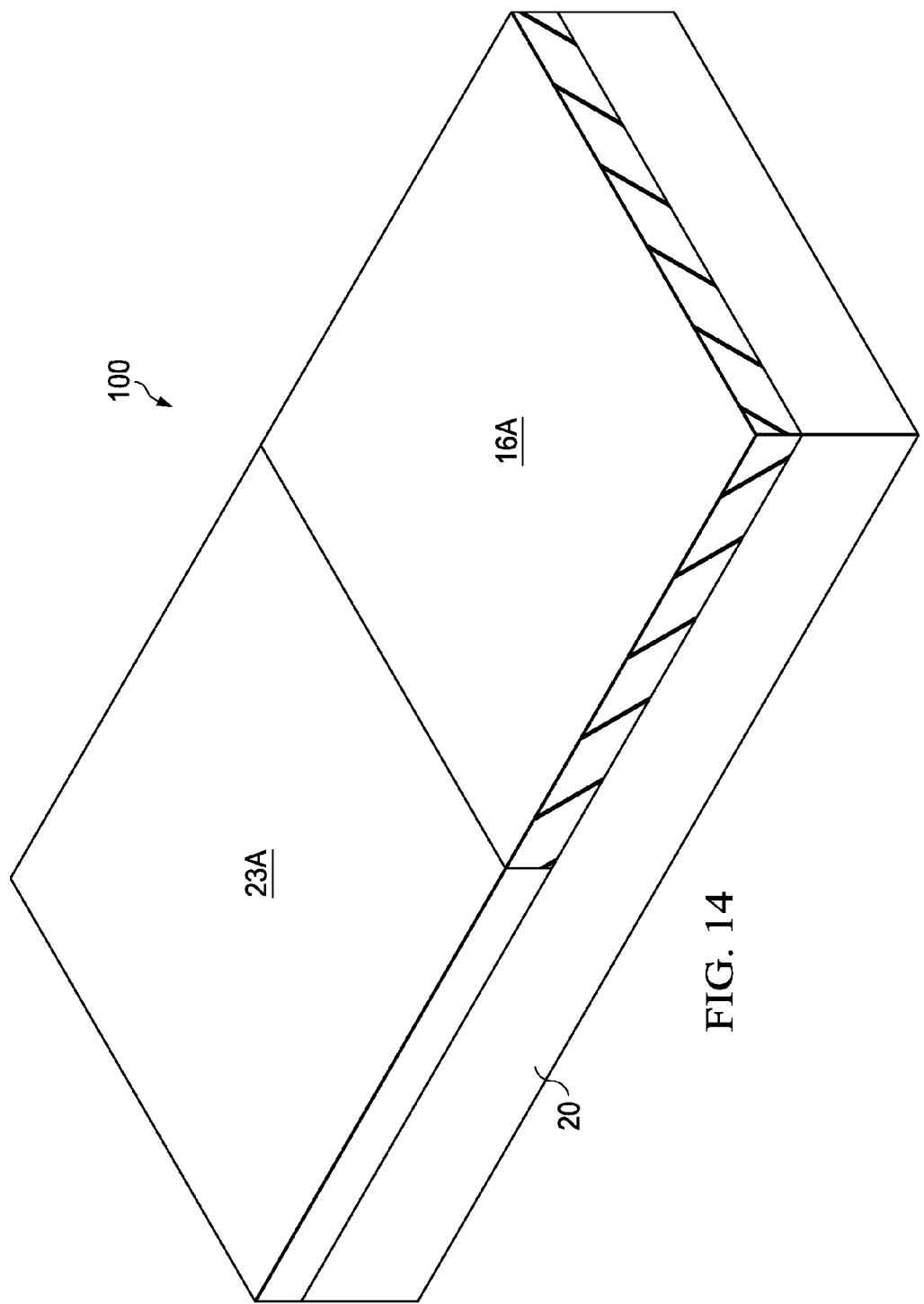
FIGS. 14 through 17 illustrate perspective views of various intermediate steps of manufacturing a combination finFET in in accordance with some alternative embodiments.
Figure 15:
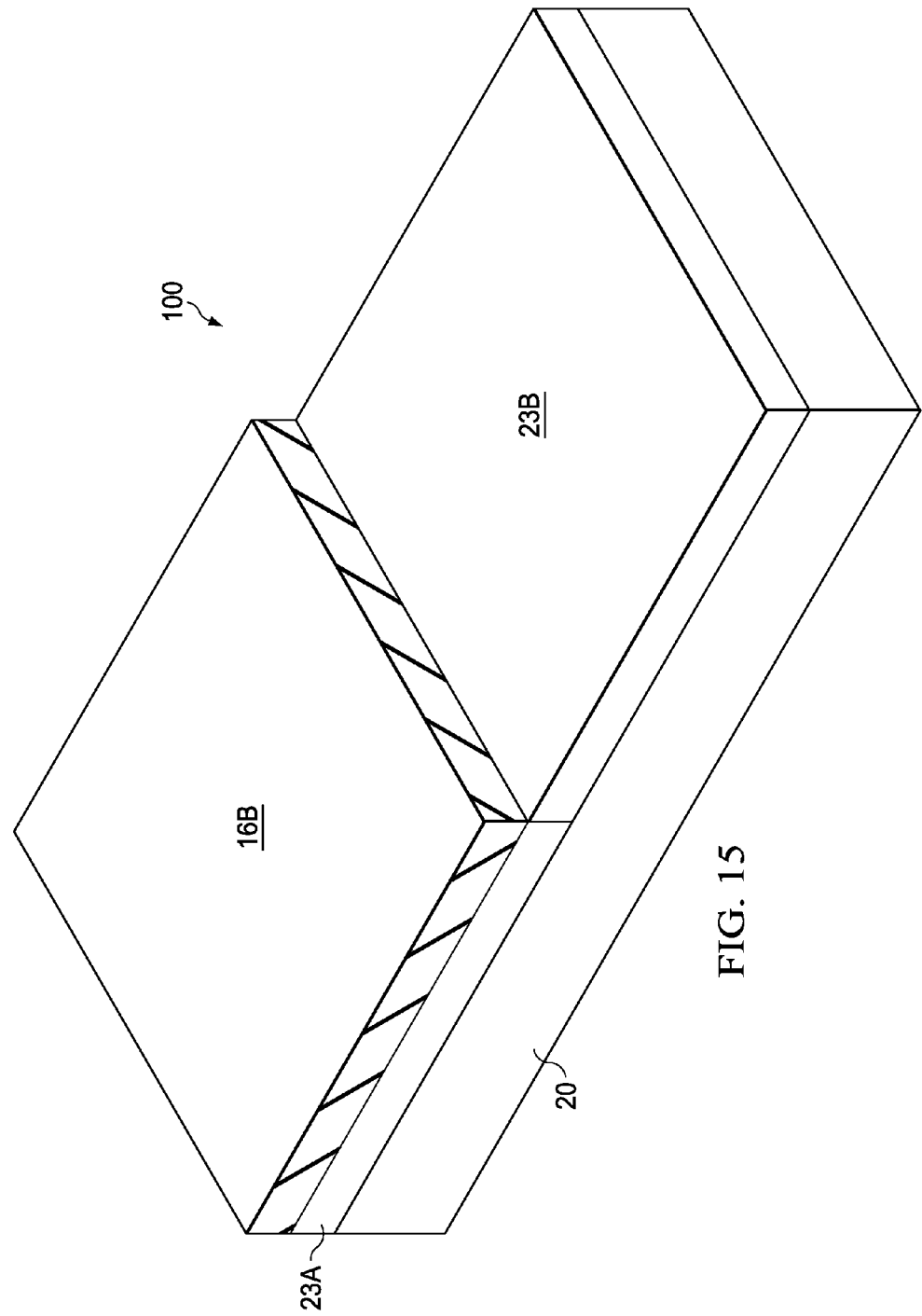

In FIGS. 14 and 15, semiconductor strips 23 may be formed over a substrate 20 prior to the formation of any STI regions 22. For example, as illustrated by FIG. 14, an epitaxy is performed to epitaxially grow n-channel semiconductor strip 23A over substrate 20. During the epitaxy of n-channel semiconductor strip 23A, an n-type impurity may be in-situ doped. Hard mask 16A (e.g., comprising silicon oxide or silicon nitride) may be used to mask portions of substrate 20 that may be subsequently used for p-channel growth. After n-channel semiconductor strip 23A is grown, hard mask 16A may be removed.

FIG. 15 illustrates the growth of p-channel semiconductor strip 23B over substrate 20. A process similar to the process illustrated by FIG. 14 may be used to epitaxially grow and p-channel semiconductor strip 23B. Hard mask 16B (e.g., comprising silicon oxide or silicon nitride) may be used to mask n-channel semiconductor strip 23A during the formation of p-channel semiconductor strip 23B. During the epitaxy of p-channel semiconductor strip 23B, a p-type impurity may be in-situ doped. After p-channel semiconductor strip 23B are grown, hard mask 16B may be removed.

Figure 16:
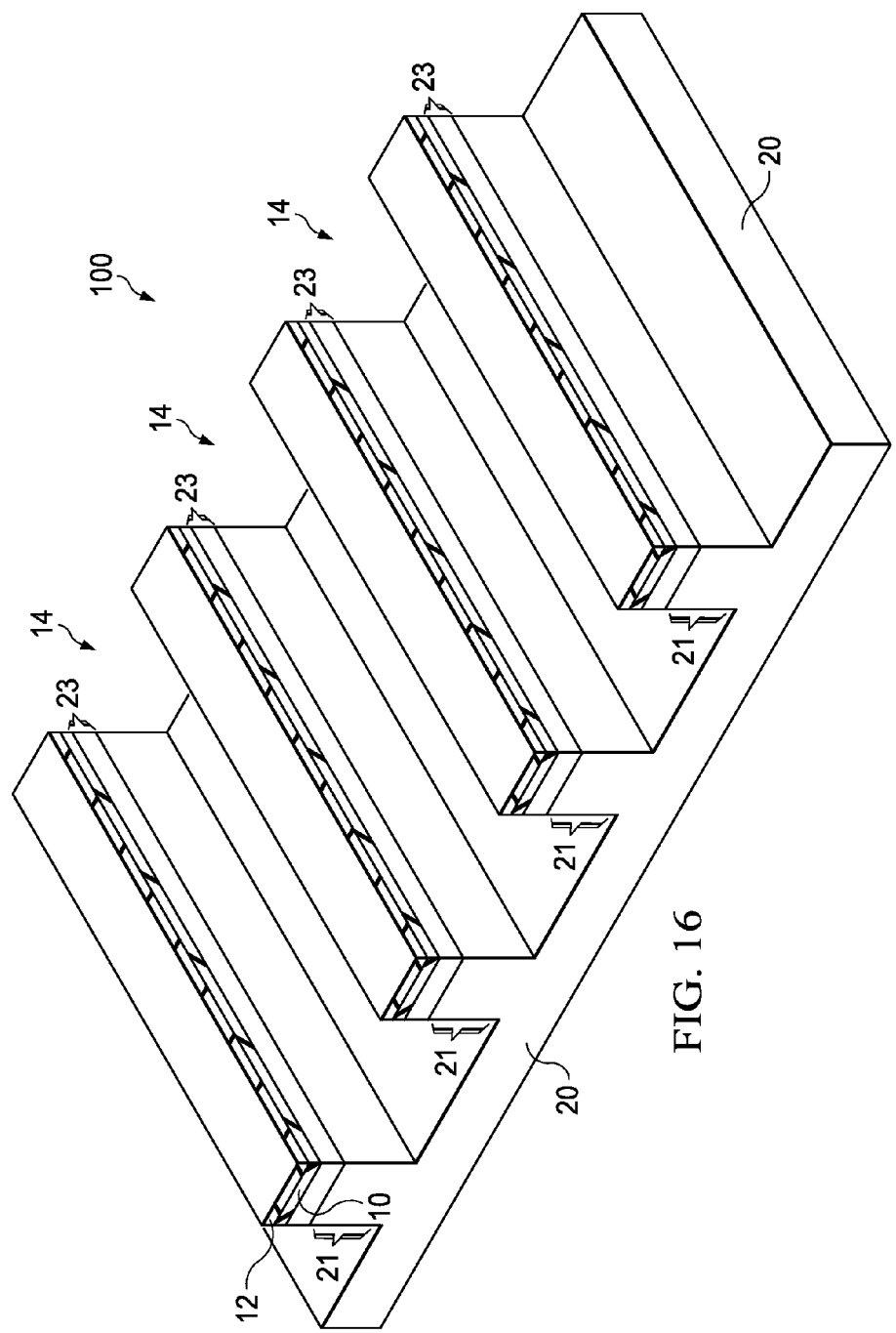

Pad layers 10 and 12 may be formed over semiconductor strips 23. Next, openings 14 may be patterned in pad layers 10 and 12, semiconductor strips 23, for example, using photolithography and etching. The portions of substrate 20 between openings 14 are semiconductor strips 21. Thus fins 21/23 are formed extending upwards from substrate 20. The resulting structure is illustrated in FIG. 16.

Figure 17:
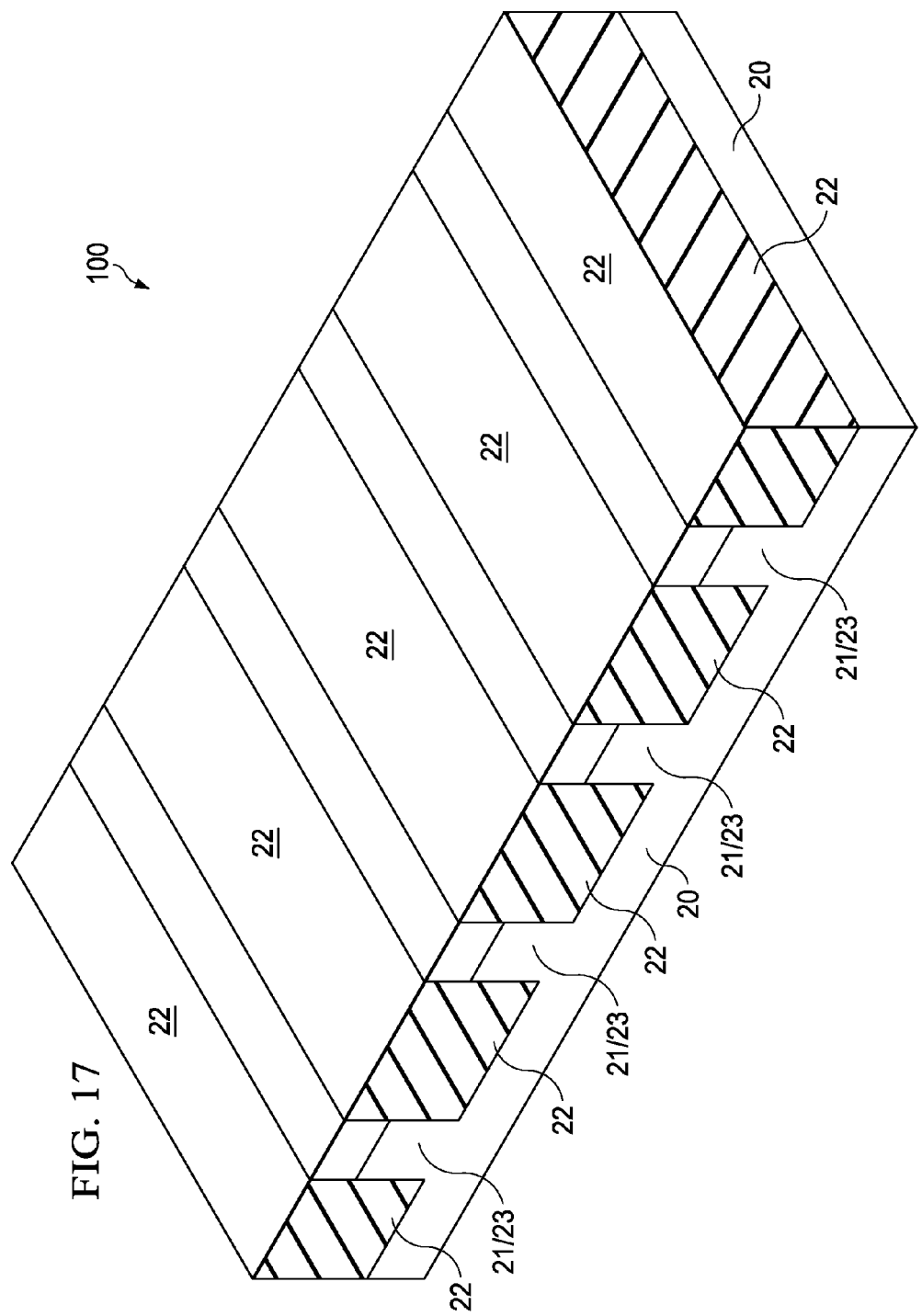

Openings 14 may be filled with a dielectric material, such as, silicon oxide, silicon nitride, silicon oxynitride, fluoride-doped silicate glass (FSG, or another low-k dielectric material. The filling of openings 14 may be done using any suitable process such as a chemical vapor deposition (CVD) process, or the like. An annealing process may be performed on the dielectric material. A chemical mechanical polish (CMP) or etch back process may be used to level a top surface of the dielectric material using pad layer 12 may be used as an etch stop layer. Pad layer 12 may be removed after the CMP/etch back process. Subsequently, well and anti-punch through (APT) dopants may be implanted into substrate 20 and the dielectric material. Pad layer 10 may then be removed. FIG. 17 illustrates completed STI regions 22 formed between fins 21/23. The top surfaces of fins 21/23 and the top surfaces of STI regions 22 may be substantially level with each other.

In another example method for forming a combination finFet, the two semiconductor materials of channel regions 24 may be exposed in two separate process steps. While FIG. 7 illustrates exposing channel regions 24 of fins 21/23 by recessing STI regions 22 in a single recessing step, FIGS. 18 through 21B illustrate perspective views of intermediary steps of manufacturing combination finFET in wafer 100 in accordance with alternative embodiments where channel regions 24 are formed in two separate recessing steps.

Figure 18:
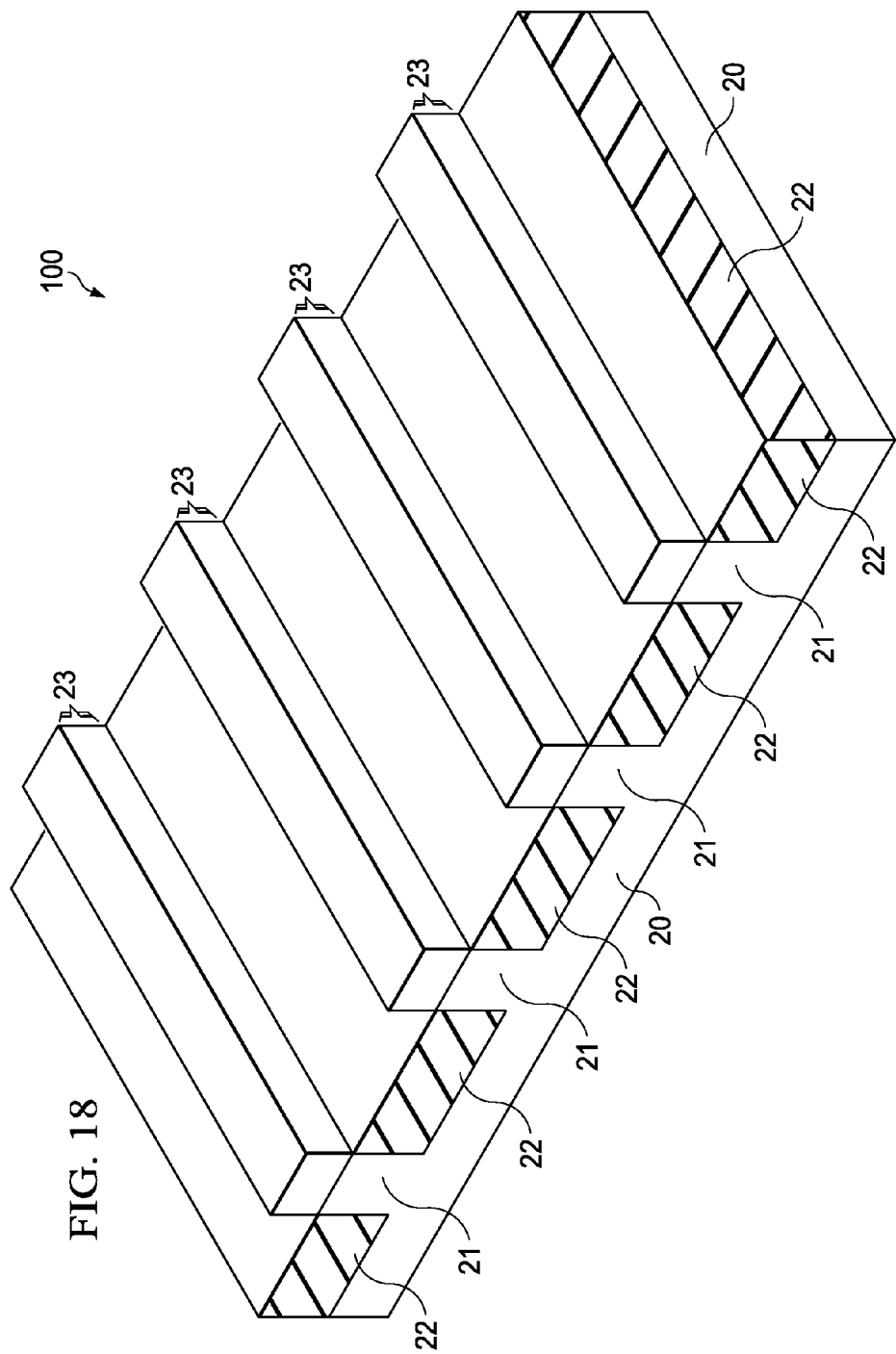
FIGS. 18 through 21B illustrate perspective views of various intermediate steps of manufacturing a combination finFET in in accordance with some other alternative embodiments.

FIG. 18 illustrates wafer 100 after a partial recessing of STI regions 22, for example, though chemical etching. After the partial recessing, at least a portion of semiconductor strips 23 are exposed. However, the partial recessing may not expose portions of semiconductor strips 21. Top surfaces of semiconductor strips 21 and STI regions 22 may be substantially level.

Figure 19:
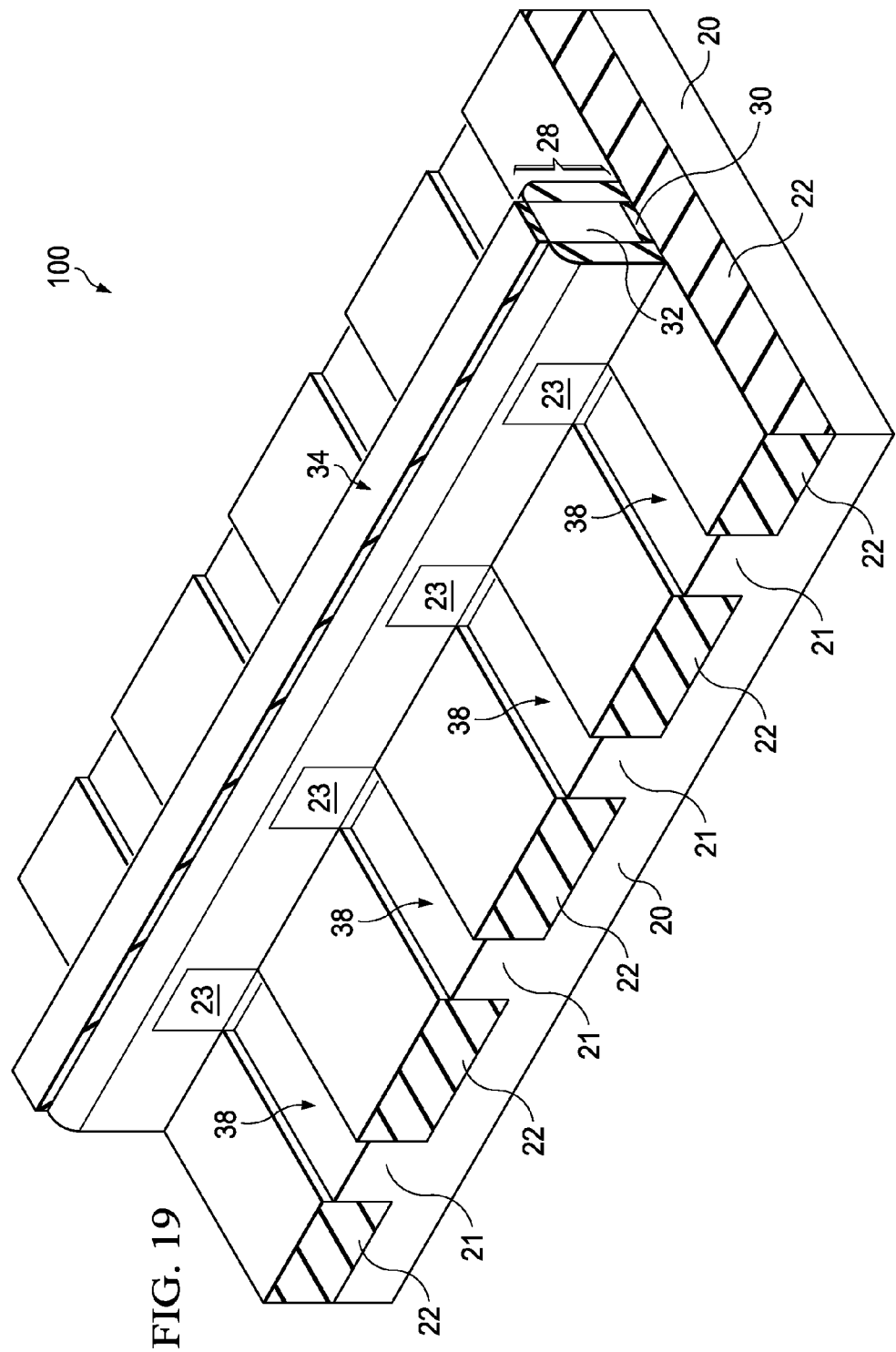

Subsequently, as illustrated by FIG. 19, a gate stack 28 (e.g., having dummy gate 32, dummy oxide 30, and hard mask 34) may be formed on the top surface and the sidewalls of semiconductor strips 23. Gate stack 28 crosses over a plurality of semiconductor fins 21/23 and/or STI regions 22. Due to the partial recessing of STI regions 22, gate stack 28 may not cover sidewalls of semiconductor strips 21. Gate stack 28 may also have a lengthwise direction substantially perpendicular to the lengthwise direction of semiconductor fins 21/23. Gate spacers 36 are also formed on the sidewalls of gate stack 28.

As also illustrated by FIG. 19, an etching step is performed to recess portions of semiconductor fins 21/23 that are not covered by gate stack 28 and gate spacers 36. Recesses 38 are accordingly formed between STI regions 22. Recesses 38 are located on the opposite sides of gate stack 28. After the formation of recesses 38, a lightly doped drain (LDD) and annealing may be performed on exposed surfaces of semiconductor strips 21.

Figure 20:
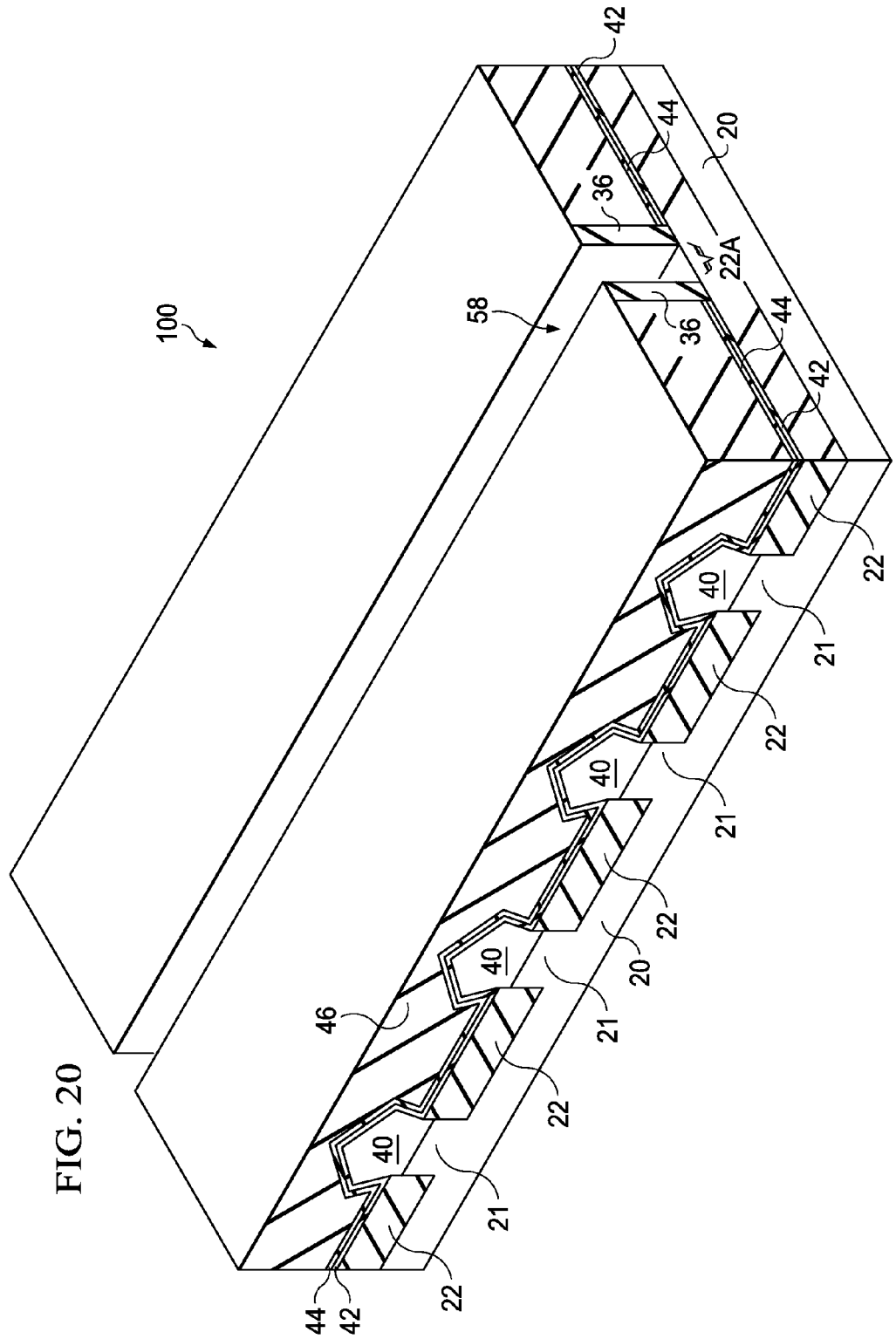

FIG. 20 illustrates the formation of source and drain regions 40 (e.g., through epitaxial growth and doping). Source and drain regions 40 are on the opposite sides of gate stack 28, and may be overlying and overlapping portions of surfaces of STI regions 22. Buffer oxide layer 42, CESL 44, and ILD 46 are formed over source/drain regions 40 and STI regions 22. Gate stack 28 may then be removed forming a recess 58 between gate spacers 36. The removal of gate stack 28 may expose regions 22A of STI regions 22 between gate spacers 36.

Figure 21A:
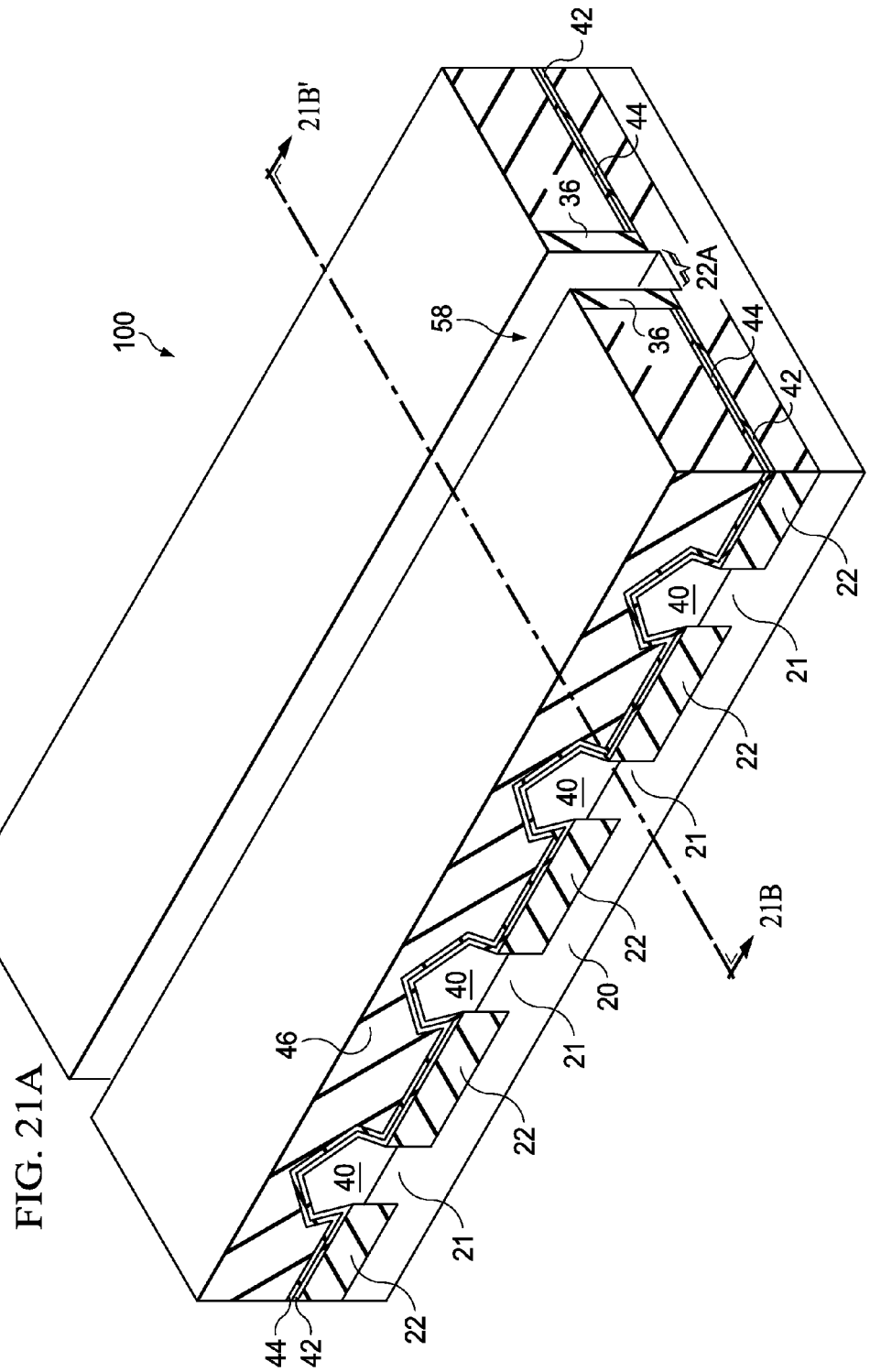
Figure 21B:
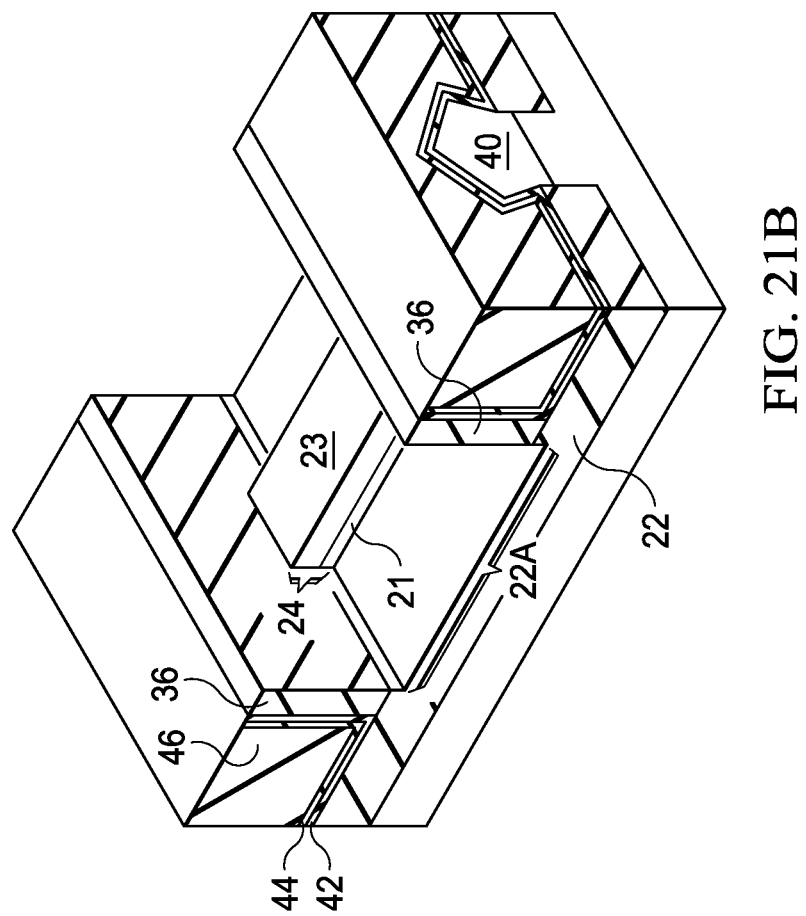

FIGS. 21A and 21B illustrate the further recessing of STI regions 22A between gate spacers 36 in recess 58. The recessing of STI regions 22A exposes the material of semiconductor material of semiconductor strip 21 as more clearly illustrated in FIG. 21B. FIG. 21B illustrates an alternate perspective view obtained from the vertical plane crossing line 21B-21B' in FIG. 21A, where the vertical plane cuts through, and extends in a direction parallel to source and drain regions 40.

As clearly illustrated by FIG. 21B, the second recessing of exposed STI region 22A between gate spacers 36 at least partially exposes semiconductor strip 21. The resulting channel region 24 includes the material of both semiconductor strips 21 and 23. Thus, when a conductive gate stack (e.g., gate stack 54) is formed between gate spacers 36 in subsequent process steps (e.g., as illustrated in FIGS. 11 and 12), the gate stack wraps around a channel region having at least two different semiconductor materials. Thus, as illustrated by FIGS. 18 through 21B, the formation of channel region 24 may include two different recessing steps. STI regions 22 may be partially recessed prior to the formation of source and drain regions 40. Subsequently, STI regions 22 may be further recessed to expose semiconductor strip 21 after ILD 46 is formed and gate stack 28 is removed.

As described above, a combination finFET includes a gate stack over and on sidewalls of channel region of a fin. The channel region includes at least two semiconductor materials. The first semiconductor material may have a relatively high mobility while the second semiconductor material may have a relatively low interface trap density. A ratio of a vertical of the first semiconductor material to a vertical dimension of the channel region may be at least about 0.6 but less than 1. By balancing the two different materials in a channel region of a finFET, improved overall mobility and electrical performance may be achieved.

In accordance with an embodiment, a fin field effect transistor (finFET) includes a fin extending upwards from a semiconductor substrate and a gate stack. The fin includes a channel region. The gate stack is disposed over and covers sidewalls of the channel region. The channel region includes at least two different semiconductor materials.

In accordance with another embodiment, a semiconductor device includes a first semiconductor strip over a substrate and a second semiconductor strip over the first semiconductor strip. The first and the second semiconductor strips include different semiconductor materials. The semiconductor device further includes a channel region and a gate stack over and covering sidewalls of the channel region. The channel region includes the second semiconductor strip and at least a portion of the first semiconductor strip. A ratio of a first vertical dimension of the second semiconductor strip to a second vertical dimension of the channel region is at least 0.6.

In accordance with yet another embodiment, a method for forming a semiconductor device includes forming a first semiconductor strip over a substrate and forming a second semiconductor strip over the first semiconductor. The second semiconductor strip is formed of a different semiconductor material than the first semiconductor strip. The method further includes forming a first shallow trench isolation (STI) region and a second STI region over the substrate. The first and the second semiconductor strips are disposed between the first and the second STI regions, and a top surface of the second semiconductor strip is substantially level with top surfaces of the first and second STI regions. The top surfaces of first and second STI regions are recessed so that top surface of the first semiconductor strip is higher than the top surfaces of the first and second STI regions. A gate stack is formed over and extending along sidewalls of the first and second semiconductor strips exposed by recessing the top surfaces of the first and second STI regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (finFET) comprising:
a fin extending upwards from a semiconductor substrate; and
a gate stack disposed over and covering sidewalls of a channel region of the fin, wherein the channel region comprises a first semiconductor material and at least a portion of a second semiconductor material, the first semiconductor material different from the second semiconductor material, wherein the second semiconductor material contacts both the gate stack and a shallow trench isolation (STI) region, wherein an interface of the gate stack and the first semiconductor material has a higher interface trap density than an interface of the gate stack and the second semiconductor material, wherein the channel region further comprises an interdiffusion region.

2. The finFET of claim 1, wherein the first semiconductor material has a first vertical dimension and the channel region has a second vertical dimension, and wherein a ratio of the first vertical dimension to the second vertical dimension is at least about 0.6.

3. The finFET of claim 1, wherein an atomic percentage of germanium in the first semiconductor material is at least about ten percent.

4. The finFET of claim 1, wherein the first semiconductor material is germanium, silicon germanium, indium gallium arsenic, or silicon germanium tin.

5. The finFET of claim 1, wherein the second semiconductor material is silicon, silicon germanium, or silicon germanium tin.

6. The finFET of claim 1, wherein the fin further comprises a third semiconductor material, the third semiconductor material different from the first semiconductor material and the second semiconductor material.

7. The finFET of claim 1, wherein a first horizontal dimension of the first semiconductor material is wider than a second horizontal dimension of an interface between the first semiconductor material and the second semiconductor material.

8. A semiconductor device comprising:
a first shallow trench isolation (STI) region over a substrate;
a first semiconductor strip over the substrate;
a second STI region over the substrate, the first semiconductor strip disposed between the first STI region and the second STI region, a top surface of the first STI region being lower than a top surface of the second STI region;
a second semiconductor strip over the first semiconductor strip, wherein the first and the second semiconductor strips comprise different semiconductor materials;
a channel region, wherein the channel region comprises the second semiconductor strip and at least a portion of the first semiconductor strip, and wherein a ratio of a first vertical dimension of the second semiconductor strip to a second vertical dimension of the channel region is at least 0.6; and
a gate stack over and covering sidewalls of the channel region.

9. The semiconductor device of claim 8, wherein the first semiconductor strip comprises a first semiconductor material and the second semiconductor strip comprises a second semiconductor material, wherein the second semiconductor material has a higher mobility than the first semiconductor material, and wherein the first semiconductor material has a lower interface trap density than the second semiconductor material.

10. The semiconductor device of claim 9, wherein the top surface of the first STI region is lower than a top surface of the first semiconductor strip.

11. The semiconductor device of claim 9, wherein the top surface of the first STI region is concave.

12. The semiconductor device of claim 9, wherein the top surface of the first STI region is convex.

13. A semiconductor device comprising:
a fin extending upward from a semiconductor substrate, wherein the fin comprises:
  a first semiconductor material;
  a second semiconductor material over the first semiconductor material, wherein the second semiconductor material comprises a higher mobility and a higher interface trap density than the first semiconductor material; and
  a third semiconductor material under and different than the first semiconductor material; and
a gate stack over the fin, extending along sidewalls of the second semiconductor material, and extending at least partially along sidewalls of the first semiconductor material, wherein the gate stack comprises:
  a gate dielectric; and
  a gate electrode over the gate dielectric; and
a shallow trench isolation (STI) region, the STI region extending along remaining portions of the sidewalls of the first semiconductor material not extending along the gate stack.

14. The semiconductor device of claim 13, wherein a portion of the fin wrapped by the gate stack defines a channel region of the fin, and wherein a vertical dimension of the second semiconductor material is at least sixty percent of a vertical dimension of the channel region of the fin.

15. The semiconductor device of claim 13, wherein an interface between the third semiconductor material and the first semiconductor material is substantially level.

16. The semiconductor device of claim 13, wherein an interface between the third semiconductor material and the first semiconductor material is concave or convex.

17. The semiconductor device of claim 13, wherein an interface between the first semiconductor material and the second semiconductor material has an inter-diffusion region.

18. The semiconductor device of claim 8, wherein a first horizontal dimension of the second semiconductor strip is wider than a second horizontal dimension of an interface between the first semiconductor strip and the second semiconductor strip.

19. The semiconductor device of claim 8, wherein a first horizontal dimension of the second semiconductor strip is narrower than a second horizontal dimension of an interface between the first semiconductor strip and the second semiconductor strip.

20. The finFET of claim 1, wherein a first horizontal dimension of the first semiconductor material is less than a second horizontal dimension of an interface between the first semiconductor material and the second semiconductor material.

* * * * *